(12) United States Patent
Nukui et al.

(10) Patent No.: US 10,664,118 B2
(45) Date of Patent: May 26, 2020

(54) CONDUCTIVE FILM AND TOUCH PANEL

(71) Applicant: FUJIFILM Corporation, Tokyo (JP)

(72) Inventors: Katsuyuki Nukui, Kanagawa (JP); Kensuke Katagiri, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/259,371

(22) Filed: Jan. 28, 2019

(65) Prior Publication Data

US 2019/0155424 A1 May 23, 2019

Related U.S. Application Data

(63) Continuation of application No. PCT/JP2017/027016, filed on Jul. 26, 2017.

(30) Foreign Application Priority Data

Aug. 18, 2016 (JP) .................................. 2016-160570

(51) Int. Cl.
*G06F 3/047* (2006.01)
*G06F 3/044* (2006.01)
(Continued)

(52) U.S. Cl.
CPC .............. *G06F 3/047* (2013.01); *G06F 3/044* (2013.01); *G06F 3/0412* (2013.01);
(Continued)

(58) Field of Classification Search
CPC ...... G06F 3/047; G06F 3/0446; G06F 3/0445; G06F 3/0412; G06F 3/044;
(Continued)

(56) References Cited

U.S. PATENT DOCUMENTS

2011/0096005 A1* 4/2011 Kim ..................... G06F 3/044
345/173
2011/0290631 A1* 12/2011 Kuriki .................. G06F 3/044
200/600
(Continued)

FOREIGN PATENT DOCUMENTS

JP          5508565 B1    3/2014
JP       2014-115694 A    6/2014
(Continued)

OTHER PUBLICATIONS

International Search Report issued in PCT/JP2017/027016 dated Oct. 31, 2017.
(Continued)

*Primary Examiner* — Premal R Patel
(74) *Attorney, Agent, or Firm* — Edwards Neils LLC; Jean C. Edwards, Esq.

(57) ABSTRACT

A touch panel has a transparent substrate, a conductive film; a protective layer which is provided on the conductive film to protect the conductive film; and a display device which has a display unit. the conductive film includes: a transparent substrate; a detecting portion provided on at least one surface of the transparent substrate and is provided with a mesh pattern formed of thin metallic wires; and a peripheral wiring portion provided on at least one surface of the transparent substrate and is electrically connected to the detecting portion, a region where the detecting portion is provided is set as a first region and a region other than the first region is set as a second region in the transparent substrate, a wire width change region is present in at least a part of a boundary region including a boundary line between the first region and the second region.

12 Claims, 4 Drawing Sheets

(51) Int. Cl.
*G06F 3/041* (2006.01)
*H01L 27/32* (2006.01)

(52) U.S. Cl.
CPC .......... *G06F 3/0445* (2019.05); *G06F 3/0446* (2019.05); *H01L 27/323* (2013.01); *G06F 2203/04103* (2013.01); *G06F 2203/04112* (2013.01)

(58) Field of Classification Search
CPC . G06F 2203/04103; G06F 2203/04112; H01L 27/323
See application file for complete search history.

(56) References Cited

U.S. PATENT DOCUMENTS

| | | | | |
|---|---|---|---|---|
| 2012/0312677 | A1* | 12/2012 | Kuriki | H03K 17/9622 200/600 |
| 2013/0222325 | A1* | 8/2013 | Cok | G06F 3/044 345/174 |
| 2015/0109246 | A1 | 4/2015 | Lee et al. | |
| 2015/0138453 | A1 | 5/2015 | Jang et al. | |
| 2016/0018348 | A1* | 1/2016 | Yau | G06F 3/044 324/697 |
| 2017/0250228 | A1* | 8/2017 | Liao | H01L 27/323 |
| 2018/0107297 | A1* | 4/2018 | Chau | C25D 5/00 |

FOREIGN PATENT DOCUMENTS

| | | |
|---|---|---|
| JP | 2015-079513 A | 4/2015 |
| JP | 2015-099577 A | 5/2015 |
| JP | 2016-038915 A | 3/2016 |

OTHER PUBLICATIONS

Written Opinion issued in PCT/JP2017/027016 dated Oct. 31, 2017.
International Preliminary Report on Patentability completed by WIPO dated Jul. 6, 2018, in connection with International Patent Application No. PCT/JP2017/027016.

* cited by examiner

CONDUCTIVE FILM AND TOUCH PANEL

CROSS-REFERENCE TO RELATED APPLICATIONS

This application is a Continuation of PCT International Application No. PCT/JP2017/027016 filed on Jul. 26, 2017, which was published under PCT Article 21(2) in Japanese, and which claims priority under 35 U.S.C § 119(a) to Japanese Patent Application No. 2016-160570 filed on Aug. 18, 2016. The above applications are hereby expressly incorporated by reference, in their entirety, into the present application.

BACKGROUND OF THE INVENTION

1. Field of the Invention

The present invention relates to a conductive film which is disposed on a display unit of a display device, and a touch panel which is provided with the conductive film, and particularly, to a conductive film capable of achieving both an improvement in image quality of a display image and a reduction in resistance of a detecting portion, and a touch panel which is provided with the conductive film.

2. Description of the Related Art

In various kinds of electronic equipment including portable information equipment such as tablet computers and smartphones, touch panels, which are used in combination with a display device such as a liquid crystal display device to allow an input operation to electronic equipment by contact with a screen, have been in widespread use in recent years.

As the touch panel, a conductive film in which a detecting portion which detects a contact is formed on a transparent substrate is used.

The detecting portion is made of a transparent conductive oxide such as indium tin oxide (ITO), or a metal other than the transparent conductive oxide. The metal has advantages in that patterning is more easily performed on it, and it has more excellent flexibility and a lower resistance than the transparent conductive oxide. Accordingly, a metal such as copper or silver is used for a thin conductive wire in a touch panel or the like.

In JP2014-115694A, a touch panel using a thin metallic wire is described. In JP2014-115694A, the touch panel is a capacitance sensor provided with a base material, a plurality of Y-electrode patterns, a plurality of X-electrode patterns, a plurality of juniper insulating layers, a plurality of jumper wires, and a transparent insulating layer. Each of the plurality of Y-electrode patterns has a substantially rhombus shape, and these are arranged in matrix in an X-direction and a Y-direction on a surface of the base material such that the apexes thereof are opposed to each other. Each of the plurality of X-electrode patterns has substantially the same rhombus shape as the Y-electrode pattern. In JP2014-115694A, the X-electrode patterns and the Y-electrode patterns are rhombus mesh patterns.

In a conductive film which is used for a touch sensor, a rhombus mesh pattern formed of two kinds of equally spaced parallel lines are generally provided, like the substantially rhombus pattern of JP2014-115694A.

SUMMARY OF THE INVENTION

In recent years, it is important for touch sensors to deal with frame narrowing, a large screen, and an improvement in image quality. In order to deal with a narrow frame, it is required to reduce dimensions of lines and spaces of peripheral wires. In a case where the dimensions of lines and spaces are reduced, the wire volume is reduced, and thus the resistance value of the peripheral wires is increased.

In a case where a touch sensor has a mesh pattern formed of thin wires, it is required to increase the length of the mesh pattern formed of thin wires in order to deal with a large screen, and as a result, the resistance value of the entire mesh pattern is increased. In order to deal with an improvement in image quality, the mesh pattern is subjected to thinning to make it difficult to visually recognize thin wires. However, the thinning of the mesh pattern leads to a reduction in cross-sectional area of the wires, and the resistance value of the metal mesh sensor is increased. However, in order to maintain the response speed of the touch sensor within a certain range, it is necessary to prevent the resistance of the metal mesh sensor from being increased.

As described above, in order to deal with frame narrowing, an increase in size of a screen, and an improvement in image quality, it is necessary to prevent the resistance of the metal mesh sensor from being increased. Regarding achieving both an improvement in image quality and a reduction in resistance of the metal mesh sensor, JP2014-115694A has a problem in that the resistance value cannot be sufficiently reduced.

An object of the invention is to provide a conductive film capable of solving the problems based on the above-described related art and achieving both an improvement in image quality of a display image and a reduction in resistance of a detecting portion, and a touch panel which is provided with the conductive film.

In order to achieve the object, according to a first aspect of the invention there is provided a conductive film which is installed on a display unit of a display device, the film comprising: a transparent substrate; a detecting portion which is provided on at least one surface of the transparent substrate and is provided with a mesh pattern formed of thin metallic wires; and a peripheral wiring portion which is provided on at least one surface of the transparent substrate and is electrically connected to the detecting portion, in which in a case where a region where the detecting portion is provided is set as a first region and a region other than the first region is set as a second region in the transparent substrate, a wire width change region is present in at least a part of a boundary region including a boundary line between the first region and the second region, in the wire width change region, a wire width of the thin metallic wire of the detecting portion is larger than a reference wire width of the thin metallic wire at a center of the first region, and is continuously increased along a direction from the first region to the second region.

The boundary region may be a region including the boundary line and extending across the first region and the second region. The wire width change region may be present throughout the entire boundary region.

It is preferable that the boundary region preferably have a quadrangular shape, and the wire width change region be present at a part of at least one side of the quadrangular shape.

It is preferable that the detecting portion have a plurality of detecting electrodes, the peripheral wiring portion have a plurality of peripheral wires, the plurality of detecting electrodes be electrically connected to the plurality of peripheral wires, respectively, and the wire width change region be present in the boundary region of a detecting electrode, to which the longest peripheral wire is connected, among the plurality of detecting electrodes. The detecting portion may have a dummy electrode which is electrically insulated from the detecting electrode.

It is preferable that in a case where an increase rate of the wire width of the thin metallic wire is represented by Y, a reference wire width of the thin metallic wire at the center of the first region is represented by W0, a largest wire width of the thin metallic wire in the first region is represented by Wmax, and a ratio of the largest wire width to the reference wire width is represented by Wmax/W0, Y≤2.0, Wmax/W0≤2.5, 0.5×(Wmax/W0)≤Y, and Y≤4.77×(Wmax/W0)−4.19 be simultaneously satisfied.

According to a second aspect of the invention, there is provided a touch panel comprising: the conductive film according to the first aspect; a protective layer which is provided on the conductive film to protect the conductive film; and a display device which has a display unit, in which the first region is superposed on a display region of the display unit such that the conductive film is disposed on the display device.

According to the invention, it is possible to achieve both an improvement in image quality and a reduction in resistance.

DESCRIPTION OF THE PREFERRED EMBODIMENTS

Hereinafter, a conductive film and a touch panel according to an embodiment of the invention will be described in detail based on preferable embodiments illustrated in the accompanying drawings.

In the following description, the expression "to" indicating a numerical value range includes numerical values on both sides of "to". For example, in a case where a is a numerical value α1 to a numerical value β1, the range of ε includes the numerical value α1 and the numerical value β1, and is expressed as α1≤ε≤β1 in mathematical symbols.

An angle expressed using the expression such as "parallel", "vertical", or "perpendicular" includes an error range that is generally permitted in the technical field unless otherwise noted.

The expression transparent means that the light transmittance is at least 60% or greater, preferably 75% or greater, more preferably 80% or greater, and even more preferably 85% or greater in a visible light wavelength range ranging from 400 to 800 nm. The light transmittance is measured using "Plastics—Determination Of Total Luminous Transmittance And Reflectance" specified in JIS K 7375: 2008.

Figure 1:
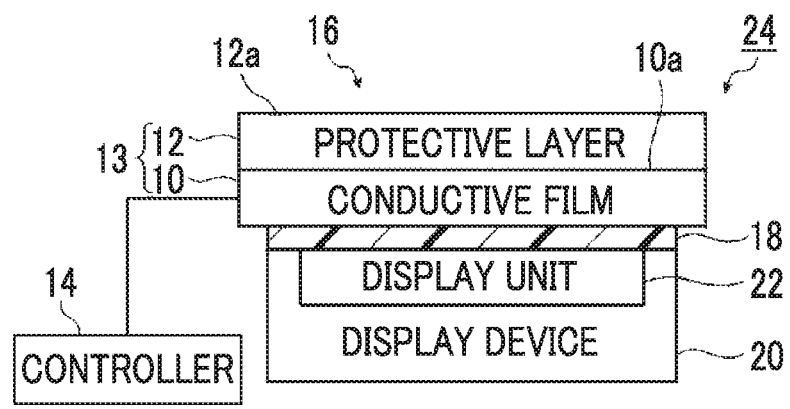
FIG. 1 is a schematic view illustrating a display device having a conductive film according to an embodiment of the invention.

FIG. 1 is a schematic view illustrating a display device having a conductive film according to the embodiment of the invention.

As illustrated in FIG. 1, a conductive film 10 is provided on a display unit 22 of a display device 20 via, for example, an optically transparent layer 18.

A protective layer 12 is provided on a front surface 10a of the conductive film 10. The conductive film 10 is connected to a controller 14.

The conductive film 10 and the protective layer 12 constitute a touch sensor 13, and the conductive film 10, the protective layer 12, and the controller 14 constitute a touch panel 16. The touch panel 16 and the display device 20 constitute display equipment 24.

A front surface 12a of the protective layer 12 serves as a surface on which a display object displayed in a display region (not shown) of the display unit 22 is visually recognized. In addition, the front surface 12a of the protective layer 12 serves as a touch surface of the touch panel 16.

The controller 14 is formed of a known controller which is used for detection of a capacitance-type touch sensor or a resistance film-type touch sensor. In the touch sensor 13, a position where the capacitance changes by the contact of a finger or the like with the front surface 12a of the protective layer 12 is detected by the controller 14 in a case where the touch sensor is a capacitance type. In a case where the touch sensor is a resistance film type, a position where the resistance changes is detected by the controller 14.

The protective layer 12 is provided to protect the conductive film 10. The configuration of the protective layer 12 is not particularly limited. For example, glass, polycarbonate (PC), polyethylene terephthalate (PET), or an acrylic resin such as a polymethylmethacrylate resin (PMMA) is used. Since the front surface 12a of the protective layer 12 serves as a touch surface as described above, a hard coat layer may be provided on the front surface 12a as necessary.

The configuration of the optically transparent layer 18 is not particularly limited as long as the optically transparent layer is optically transparent, has an insulating property, and can stably fix the conductive film 10. As the optically transparent layer 18, for example, an optically transparent pressure sensitive adhesive (OCA, optical clear adhesive) or an optically transparent resin (OCR, optical clear resin) such as an ultraviolet (UV) curable resin can be used. The optically transparent layer 18 may be partially hollow.

A configuration in which the conductive film 10 is provided over the display unit 22 with a gap formed therebetween without the optically transparent layer 18 may be employed. This gap is also called an air gap.

The display device 20 has the display unit 22 provided with a display region (not shown), and is, for example, a liquid crystal display device. In this case, the display unit 22 is a liquid crystal display cell. The display device is not limited to a liquid crystal display device, and may be an organic electroluminescence (EL) display device. In this case, the display unit is an organic EL element.

The conductive film 10 is used for, for example, a capacitance-type touch sensor.

Figure 2:
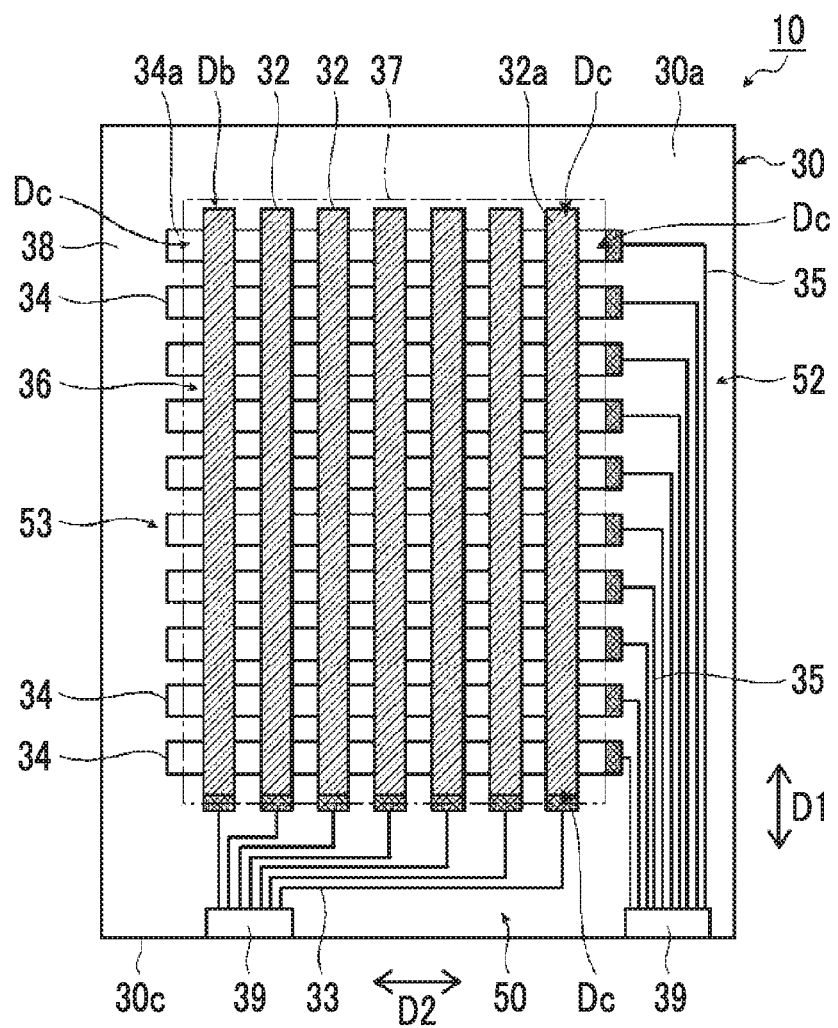
FIG. 2 is a schematic plan view illustrating a touch sensor using the conductive film according to the embodiment of the invention.
Figure 3:
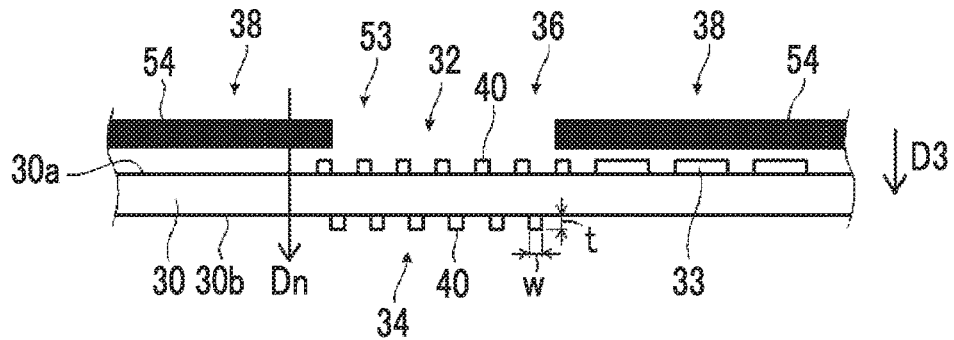
FIG. 3 is a schematic cross-sectional view illustrating the touch sensor using the conductive film according to the embodiment of the invention.

FIG. 2 is a schematic plan view illustrating a touch sensor using the conductive film according to the embodiment of the invention, and FIG. 3 is a schematic cross-sectional view illustrating the touch sensor using the conductive film according to the embodiment of the invention.

The conductive film 10 has a transparent substrate, a detecting portion which is provided on at least one surface of the transparent substrate and is provided with a mesh pattern formed of thin metallic wires, and a peripheral wiring portion which is provided on at least one surface of the transparent substrate and is electrically connected to the detecting portion.

Specifically, as illustrated in FIG. 2, a plurality of first detecting electrodes 32 extending in a first direction D1 and arranged in parallel in a second direction D2 perpendicular to the first direction D1 are formed on a front surface 30a of a transparent substrate 30, and a plurality of first peripheral wires 33 electrically connected to the plurality of first detecting electrodes 32 are arranged close to each other. The plurality of first peripheral wires 33 are collected into one terminal 39 at one side 30c of the transparent substrate 30. The plurality of first peripheral wires 33 are collectively referred to as a first peripheral wiring portion 50.

On a rear surface 30b of the transparent substrate 30 (see FIG. 3), a plurality of second detecting electrodes 34 are formed to extend in the second direction D2 and to be arranged in parallel in the first direction D1, and a plurality of second peripheral wires 35 electrically connected to the plurality of second detecting electrodes 34 are arranged close to each other. The plurality of second peripheral wires 35 are collected into one terminal 39 at one side 30c of the transparent substrate 30. The plurality of second peripheral wires 35 are collectively referred to as a second peripheral wiring portion 52.

A second detecting electrode 34 is disposed in the form of a layer such that at least a part thereof overlaps with a first detecting electrode 32 with a gap therebetween. More specifically, when viewed in a direction Dn (see FIGS. 3 and 4) vertical to one surface of the transparent substrate 30, the second detecting electrode 34 is disposed such that at least a part thereof overlaps with the first detecting electrode 32. A lamination direction D3 (see FIGS. 3 and 4) in which the first detecting electrode 32 and the second detecting electrode 34 overlap each other is the same as the vertical direction Dn (see FIGS. 3 and 4).

As illustrated in FIGS. 2 and 3, in a case where the first detecting electrodes 32 are provided on the front surface 30a of one transparent substrate 30, and the second detecting electrodes 34 are provided on the rear surface 30b, deviation in the positional relationship between the first detecting electrode 32 and the second detecting electrode 34 can be reduced even in a case where the transparent substrate 30 contracts.

The first detecting electrodes 32 and the second detecting electrodes 34 constitute a detecting portion 53.

All of the first detecting electrodes 32 and the second detecting electrodes 34, each formed of a thin metallic wire 40, form a mesh pattern provided with openings. The mesh pattern of the first detecting electrodes 32 and the second detecting electrodes 34 will be described later in detail.

Regarding the first peripheral wire 33 and the second peripheral wire 35, each of them may be formed of a thin metallic wire 40 or a conductive wire having a different wire width and a different thickness from those of the thin metallic wire 40. Each of the first peripheral wire 33 and the second peripheral wire 35 may be formed of, for example, a strip-like conductor. The constituent members of the conductive film 10 will be described later in detail.

The conductive film 10 is not limited to a conductive film for a capacitance-type touch sensor, and may be used for a resistance film-type touch sensor as long as it has a mesh pattern formed of thin metallic wires 40 as described above. Also in a resistance film-type touch sensor, a plurality of first detecting electrodes 32 and a plurality of second detecting electrodes 34 constitute a detecting portion 53.

In the conductive film 10, in the transparent substrate 30, a first region 36 is a region where the detecting portion 53 is provided, and includes a region where the plurality of first detecting electrodes 32 and the plurality of second detecting electrodes 34 are present. In the capacitance-type touch sensor, the first region 36 is a region where the contact of a finger or the like, that is, a touch can be detected. The conductive film 10 is disposed on the display device 20 such that the first region 36 is superposed on the display region of the display unit 22 of the display device 20. Therefore, the first region 36 is also a visible region. In a case where an image is displayed on the display region, the first region 36 acts as an image display region.

In the transparent substrate 30, a region other than the first region 36 is defined as a second region 38. A first peripheral wiring portion 50 and a second peripheral wiring portion 52 are formed in the second region 38, and a decorative plate 54 having a light shielding function is provided on the second region 38. By covering the first peripheral wiring portion 50 and the second peripheral wiring portion 52 with the decorative plate 54, the first peripheral wiring portion 50 and the second peripheral wiring portion 52 are made invisible, and the first region 36 which is a visible region is partitioned. The reference 37 denotes a boundary line between the first region 36 and the second region 38.

The decorative plate 54 is what is called a decorative layer in the technical field of touch panel. The configuration of the decorative plate 54 is not particularly limited as long as the first peripheral wiring portion 50 and the second peripheral wiring portion 52 can be made invisible, and a known decorative layer can be used. For the formation of the decorative plate 54, a printing method such as screen printing, gravure printing, or offset printing, a transfer method, or a vapor deposition method can be used.

The expression invisible means that the first peripheral wiring portion 50 and the second peripheral wiring portion 52 cannot be visually recognized, and means that no one can visually recognize the first and second peripheral wiring portions in a case where 10 observers see the first and second peripheral wiring portions.

Figure 4:
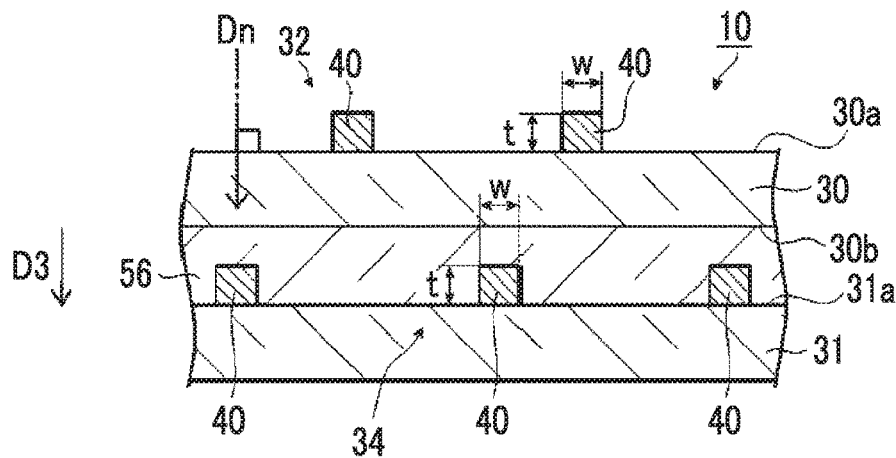
FIG. 4 is a schematic cross-sectional view illustrating another example of the configuration of the conductive film according to the embodiment of the invention.

The conductive film 10 is not particularly limited to those illustrated in FIGS. 2 and 3. For example, as in a case of a conductive film 10 illustrated in FIG. 4, one detecting electrode may be provided on one transparent substrate 30 or 31. The conductive film 10 may have a configuration in which on a rear surface 30b of one transparent substrate 30 in which a first detecting electrode 32 is provided on a front surface 30a of the transparent substrate 30, a transparent substrate 31 in which a second detecting electrode 34 is provided on a front surface 31a via an adhesive layer 56 is laminated. The transparent substrate 31 has the same configuration as the transparent substrate 30. As the adhesive layer 56, the same material as the optically transparent layer 18 can be used. In FIG. 4, the lamination direction D3 in which the first detecting electrode 32 and the second detecting electrode 34 overlap each other is the same as the vertical direction Dn.

Figure 5:
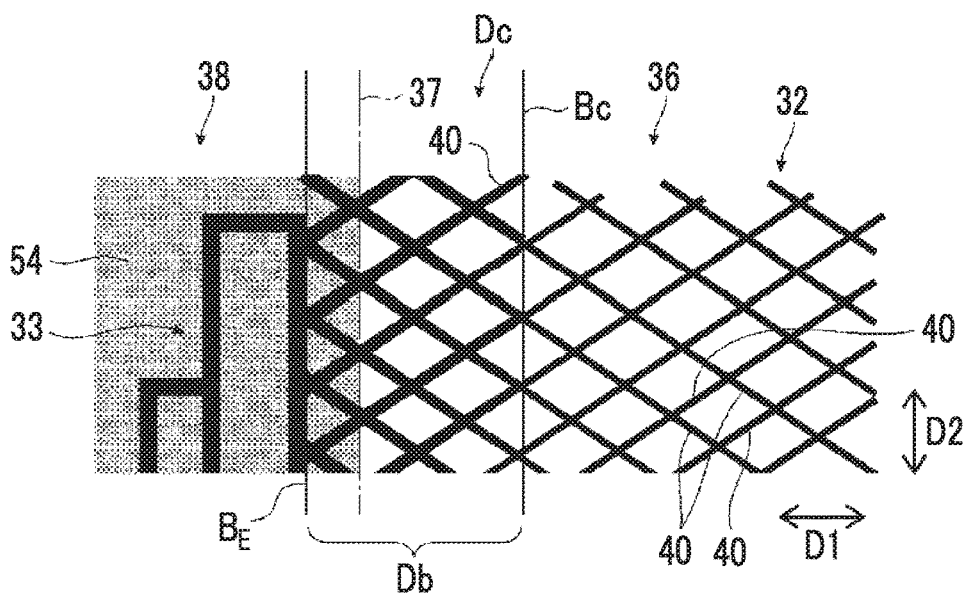
FIG. 5 is an enlarged view of a main part of the conductive film according to the embodiment of the invention.

In the conductive film 10, in the transparent substrate 30, a boundary region Db including the boundary line 37 between the first region 36 and the second region 38 is present throughout the entire boundary line 37 along the boundary line 37 in the first region 36 as illustrated in FIG. 5. The boundary region Db is, for example, a region including the boundary line 37 and extending across the first region 36 and the second region 38. In FIG. 5, a range from an electrode boundary $B_E$ between the first detecting electrode 32 and the first peripheral wire 33 to a boundary $B_C$ on the side of the first region 36 is defined as the boundary region Db.

A range from the boundary line 37 to about 2 cm distant therefrom in a direction vertical to the boundary line 37 is defined as the boundary region Db. That is, the distance between the boundary line 37 and the boundary $B_C$ is about 2 cm.

The boundary region Db may be a range from the boundary line 37 to the boundary $B_C$ on the side of the first region 36. In this case, the boundary region Db is present only in the first region 36.

A wire width change region $D_C$ is present in at least a part of the boundary region Db including the boundary line 37.

In the wire width change region Dc of the boundary region Db, the wire width of the thin metallic wire 40 of the first detecting electrode 32 present in the wire width change region Dc and the wire width of the thin metallic wire 40 of the second detecting electrode 34 are larger than a reference wire width of the thin metallic wire 40 at the center of the first region 36, and are continuously increased in a direction from the first region 36 toward the second region 38. By continuously increasing a wire width w of the thin metallic wire 40, it is possible to reduce the resistance of the first detecting electrode 32 and the second detecting electrode 34, that is, the resistance of the detecting portion 53. In this case, it is also possible to suppress an increase in resistivity associated with thinning of the thin metallic wire 40. Furthermore, in a case where the resistance can be reduced, the response speed of the touch sensor is easily maintained within a certain range even in a case where the screen size of the display region is increased.

In addition, in a case where the wire width w of the thin metallic wire 40 is continuously increased in the wire width change region Dc of the boundary region Db as described above, thick thin metallic wires 40 are present in the boundary region Db, and thus the thin metallic wire 40 is hardly disconnected as it is made thicker, and the disconnection resistance is improved. In addition, as the wire width w of the thin metallic wire 40 is increased, resistance to the flowing of overcurrent caused by static electricity is also improved, and as a result, resistance to static electricity is also improved.

As described above, in a case where the region where the wire width w of the thin metallic wire 40 is continuously increased is limited to the wire width change region Dc of the boundary region Db, an observer hardly visually recognizes the thin metallic wire, and thus it is possible to obtain an effect that substantial image quality deterioration is not recognized. That is, the influence of the thin metallic wire 40 on the display region, for example, the influence on the image quality of a display image can be reduced.

The center of the first region 36 is an intersection where two diagonal lines intersect in a case where the first region 36 is a rectangle or a square, and is a center in a case where the first region 36 is a circle.

The continuous increase in wire width of the thin metallic wire 40 means that the wire width of the thin metallic wire 40 is larger than the previous wire width in the extending direction of the thin metallic wire 40.

The continuous increase also includes a multiple stepwise increase in wire width of the thin metallic wire 40 in the extending direction of the thin metallic wire 40.

Next, a preferable range of the wire width of the thin metallic wire 40 in the wire width change region Dc of the conductive film 10 will be described.

Figure 6:
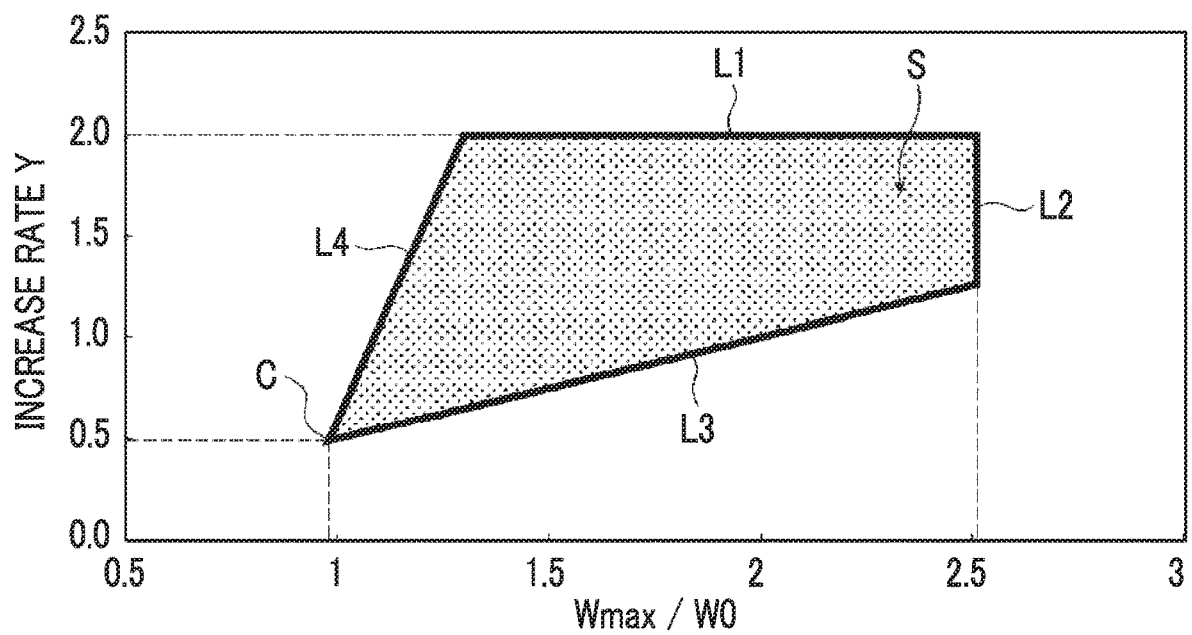
FIG. 6 is a graph illustrating a preferable range of a wire width of the conductive film according to the embodiment of the invention.

FIG. 6 is a graph illustrating a preferable wire width range of the conductive film according to the embodiment of the invention.

An increase rate of the wire width of the thin metallic wire 40 is represented by Y, a reference wire width of the thin metallic wire 40 at the center of the first region 36 is represented by W0, a largest wire width of the thin metallic wire 40 in the first region 36 is represented by Wmax, and a ratio of the largest wire width to the reference wire width is represented by Wmax/W0. The increase rate Y indicates the amount by which the width of the thin metallic wire per unit length is increased. The unit length is 1 cm.

The wire width of the thin metallic wire 40 in the wire width change region Dc preferably satisfies the following expressions (1) to (4) simultaneously. FIG. 6 is a graph illustrating the following expressions (1) to (4). In FIG. 6, the straight line L1 corresponds to the following expression (1), the straight line L2 corresponds to the following expression (2), the straight line L3 corresponds to the following expression (3), and the straight line L4 corresponds to the following expression (4). Simultaneously satisfying the following expressions (1) to (4) means that the reference wire width W0 of the thin metallic wire 40 at the center of the first region 36 and the largest wire width Wmax are within a region S shown in FIG. 6.

$$Y \leq 2.0 \qquad \text{Expression (1)}$$

$$W\max/W0 \leq 2.5 \qquad \text{Expression (2)}$$

$$0.5 \times (W\max/W0) \leq Y \qquad \text{Expression (3)}$$

$$Y \leq 4.77 \times (W\max/W0) - 4.19 \qquad \text{Expression (4)}$$

In a case where the above-described Expressions (1) to (4) are simultaneously satisfied, the thin metallic wire 40 is hardly visually recognized, and it is possible to realize a reduction in resistance. In this case, the wire width of the thin metallic wire 40 can be made at most 2.5 times larger than the reference wire width, and in a case where the increase rate is up to 2 times, the thin metallic wire 40 is more hardly visually recognized, and a further reduction in resistance can be achieved.

In order to make it more difficult to visually recognize the thin metallic wire 40 and to achieve a further reduction in resistance, the wire width of the thin metallic wire 40 is preferably reduced in a case where the increase rate is small as shown by the point C in FIG. 6.

As described above, the boundary region Db is present throughout the entire boundary line 37 along the boundary line 37. In FIG. 2, the first region 36 has a quadrangular shape, the boundary region Db also has a quadrangular shape, and the boundary region Db has four sides. The wire width change region Dc may be present in at least a part of the boundary region Db, and is not limited to being present throughout the entire boundary region Db. Therefore, a configuration in which the wire width change region Dc is present at at least one of the four sides of the boundary region Db, or a configuration in which the wire width change region Dc is present at a part of one side may be employed.

A configuration in which the wire width change region Dc is provided at a position where the resistance is high in the boundary region Db may be employed from the viewpoint of a reduction in resistance. In this case, since a plurality of detecting electrodes have the same length and the detecting electrodes have the same resistance, a detecting electrode having a long peripheral wire length has a high resistance. Therefore, a configuration in which the wire width change region Dc is present in the boundary region Db of a detecting electrode having the longest peripheral wire length may be employed.

Specifically, in FIG. 2, a first peripheral wire 33 of a first detecting electrode 32a among the plurality of first detecting electrodes 32 has the longest length. Therefore, the wire width change region Dc is provided in the boundary region Db of the first detecting electrode 32a. The wire width change region Dc may be present in the boundary regions Db at both ends of the first detecting electrode 32a, or in the boundary region Db at any one end of the first detecting electrode 32a.

Regarding the plurality of second detecting electrodes 34, a second peripheral wire 35 of a second detecting electrode 34a has the longest length. Therefore, the wire width change region Dc is provided in the boundary region Db of the second detecting electrode 34a. The wire width change region Dc may be present in the boundary regions Db at both ends of the second detecting electrode 34a, or in the boundary region Db at any one end of the second detecting electrode 34a.

Figure 7:
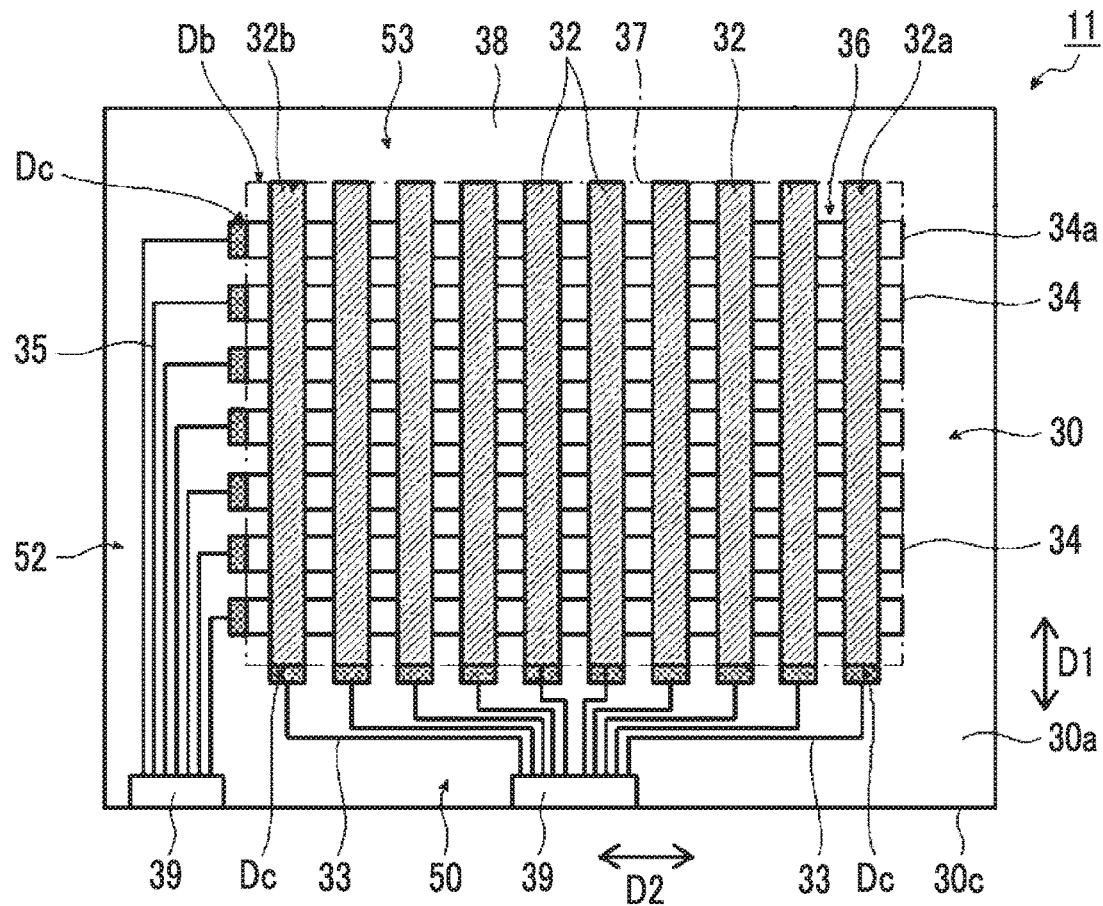
FIG. 7 is a schematic plan view illustrating another example of the arrangement of a detecting portion of the conductive film according to the embodiment of the invention.

In a conductive film 11 illustrated in FIG. 7, a terminal 39 collecting first peripheral wires 33 of a plurality of first detecting electrodes 32 is disposed at the center of one side 30c in a second direction D2. In this case, first peripheral wires 33 of a first detecting electrode 32a and a first detecting electrode 32b among the plurality of first detecting electrodes 32 have the longest length. Therefore, a wire width change region Dc is provided in a boundary region Db of the first detecting electrode 32a and the first detecting electrode 32b. The wire width change region Dc may be present in the boundary regions Db at both ends of the first detecting electrode 32a, or in the boundary region Db at any one end of the first detecting electrode 32a. In addition, the wire width change region Dc may be present in the boundary regions Db at both ends of the first detecting electrode 32b, or in the boundary region Db at any one end of the first detecting electrode 32b.

In the conductive film 11 illustrated in FIG. 7, the same components as those of the conductive film 10 illustrated in FIG. 2 are represented by the same references, and detailed description thereof is omitted.

The detecting portion may have a configuration having a dummy electrode electrically insulated from the detecting electrode. In this case, as illustrated in FIG. 8, a configuration in which a dummy electrode 60 electrically insulated from the first detecting electrode 32 is provided between the plurality of first detecting electrodes 32 in the second direction D2 may be employed.

The first detecting electrode 32 and the dummy electrode 60 are disposed with a gap 62 provided therebetween. The dummy electrode 60 is electrically insulated from the first detecting electrode 32 by the gap 62, and thus does not function as a detecting electrode. However, in a case where the dummy electrode 60 is provided, the wire width change region Dc is also set in the boundary region Db where the dummy electrode 60 is present. Since the dummy electrode 60 is electrically insulated, it does not contribute to the resistance. However, the dummy electrode 60 itself is hardly visually recognized, and thus the influence on the display region, that is, the influence on the image quality can be reduced.

The dummy electrode 60 has the same mesh pattern as the first detecting electrode 32, except that the dummy electrode is electrically insulated from the first detecting electrode 32 by the gap 62. The dummy electrode 60 can be formed as follows: a mesh pattern is produced, and then in the production of the first detecting electrode 32 only the gap 62 is removed without removing all the mesh patterns between the first detecting electrodes 32.

Figure 8:
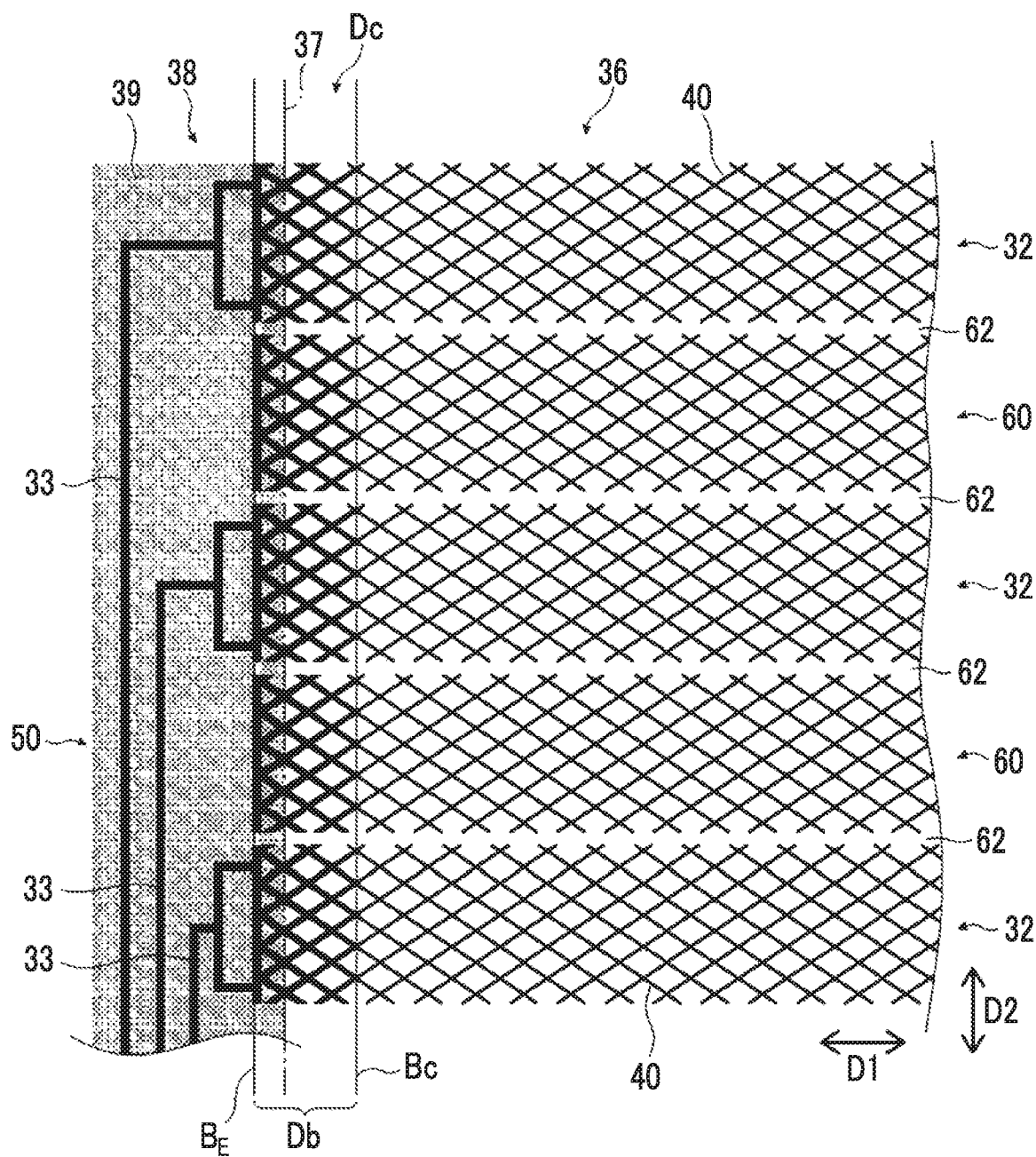
FIG. 8 is a schematic view illustrating another example of the detecting portion of the conductive film according to the embodiment of the invention.

In FIG. 8, the first detecting electrode 32 has been described as an example. However, similar to the first detecting electrode 32, the dummy electrode 60 is provided also for the second detecting electrode 34.

Hereinafter, the members of the conductive film 10 will be described.

First, the thin metallic wire 40 for the first detecting electrode 32 and the second detecting electrode 34 will be described.

The wire width w of the thin metallic wire 40 is not particularly limited., but in a case where the thin metallic wire is applied as the first detecting electrode 32 and the second detecting electrode 34, the wire width is preferably 0.5 µm to 5 µm. In a case where the wire width w of the thin metallic wire 40 is within the above range, a first detecting electrode 32 and a second detecting electrode 34 having a low resistance can be relatively easily formed. The wire width w of the thin metallic wire 40 is a wire width outside the wire width change region Dc, and the reference wire width is preferably included within the range of the wire width w of the thin metallic wire 40.

In a case where the thin metallic wire 40 is applied as a peripheral wire (lead wire), the wire width w of the thin metallic wire 40 is preferably 500 µm or less, more preferably 50 µm or less, and particularly preferably 30 µm or less. In a case where the wire width w is within the above range, a low-resistance peripheral wire can be relatively easily formed.

In a case where the thin metallic wire 40 is applied as a peripheral wire, a mesh pattern may be formed as in the case of the first detecting electrode 32 and the second detecting electrode 34, and in that case, the wire width w is not particularly limited. However, the wire width is preferably 30 µm or less, more preferably 15 µm or less, even more preferably 10 µm or less, particularly preferably 9 µm or less, and most preferably 7 µm or less, in addition, the wire width is preferably 0.5 µm or greater, and more preferably 1.0 µm or greater. In a case where the wire width w is within the above range, a low-resistance peripheral wire can be relatively easily formed. By forming a mesh pattern with the peripheral wires, the uniformity of the resistance reduction due to the irradiation on the detecting electrode and the peripheral wire can be increased in a step for pulse light irradiation from a xenon flash lamp in the formation of the first detecting electrode 32 and the second detecting electrode 34. In addition, in a case where a pressure sensitive adhesive layer is laminated, the peeling strength of the first and second detecting electrodes 32 and 34 and the peripheral wire can be made constant, and thus the in-plane distribution can be reduced.

A thickness t of the thin metallic wire 40 is not particularly limited. However, the thickness is preferably 1 to 200 µm, more preferably 30 µm or less, even more preferably 20 µm or less, particularly preferably 0.01 to 9 µm, and most preferably 0.05 to 5 µm. In a case where the thickness t is within the above range, a detecting electrode having a low resistance and excellent durability can be relatively easily formed.

Regarding the wire width w of the thin metallic wire 40 and the thickness t of the thin metallic wire 40, a cross-sectional image of the conductive film 10 including the thin metallic wires 40 is acquired, input to a personal computer, and displayed on a monitor. Horizontal lines are respectively drawn at two positions for specifying the wire width w of the thin metallic wire 40 on the monitor, and the length between the horizontal lines is obtained. Accordingly, the wire width w of the thin metallic wire 40 can be obtained. In addition, horizontal lines are respectively drawn at two positions for specifying the thickness t of the thin metallic wire 40, and the length between the horizontal lines is obtained. Accordingly, the thickness t of the thin metallic wire 40 can be obtained.

<Transparent Substrate>

Since the transparent substrate 30 and the transparent substrate 31 are the same, only the transparent substrate 30 will be described. The kind of the transparent substrate 30 is not particularly limited as long as the first detecting electrode 32, the first peripheral wire 33, the second detecting electrode 34, and the second peripheral wire 35 can be supported, but a plastic film is preferable.

As specific examples of the constituent material of the transparent substrate 30, plastic films having a melting point of about 290° C. or lower, such as polyethylene terephthalate (PET) (258° C.), polycycloolefin (134° C.), polycarbonate (250° C.), acrylic resin (128° C.), polyethylene naphthalate (PEN) (269° C.), polyethylene (PE) (135° C.), polypropylene (PP) (163° C.), polystyrene (230° C.), poly vinyl chloride (180° C.), polyvinylidene chloride (212° C.), and triacetylcellulose (TAC) (290° C.) are preferable, and PET, polycycloolefin, and polycarbonate are particularly preferable. The numerical values in the brackets are melting points.

The total light transmittance of the transparent substrate 30 is preferably 85% to 100%. The total light transmittance is measured using "Plastics—Determination Of Total Luminous Transmittance And Reflectance" specified in JIS K 7375: 2008.

A preferable aspect of the transparent substrate 30 is a treated substrate subjected to at least one selected from the group consisting of an atmospheric-pressure plasma treatment, a corona discharge treatment, and an ultraviolet irradiation treatment. By performing the above-described treatment, a hydrophilic group such as an OH group is introduced to the treated surface of the transparent substrate 30, and the adhesion of the transparent substrate 30 to the first detecting electrode 32, the first peripheral wire 33, the second detecting electrode 34, and the second peripheral wire 35 is further improved.

Among the above-described treatments, an atmospheric-pressure plasma treatment is preferable in view of further improving the adhesion of the transparent substrate 30 to the first detecting electrode 32, the first peripheral wire 33, the second detecting electrode 34, and the second peripheral wire 35.

As another preferable aspect of the transparent substrate 30, an undercoat layer including a polymer is provided on a surface where the first detecting electrode 32, the first peripheral wire 33, the second detecting electrode 34, and the second peripheral wire 35 are provided. By forming, on the undercoat layer, a photosensitive layer for forming the first detecting electrode 32, the first peripheral wire 33, the second detecting electrode 34, and the second peripheral wire 35, the adhesion of the transparent substrate 30 to the first detecting electrode 32, the first peripheral wire 33, the second detecting electrode 34, and the second peripheral wire 35 is further improved.

The method of forming an undercoat layer is not particularly limited. Examples thereof include a method including: applying an undercoat layer forming composition including a polymer to a substrate; and performing a heating treatment as necessary. The undercoat layer forming composition may include a solvent as necessary. The kind of the solvent is not particularly limited, and examples of the solvent include a solvent which is used in a photosensitive layer forming composition to be described later. A latex including fine particles of a polymer may be used as the undercoat layer forming composition including a polymer.

The thickness of the undercoat layer is not particularly limited. The thickness is preferably 0.02 to 0.3 and more preferably 0.03 to 0.2 μm in view of more excellent adhesion of the first detecting electrode 32, the first peripheral wire 33, the second detecting electrode 34, and the second peripheral wire 35 to the transparent substrate 30.

As necessary, the conductive film 10 may be provided with, for example, an antihalation layer other than the undercoat layer as another layer between the transparent substrate 30, the first detecting electrode 32, and the second detecting electrode 34.

<Thin Metallic Wire>

The thin metallic wire 40 has electroconductivity and is made of, for example, a metal or an alloy. The thin metallic wire 40 can be formed of, for example, a copper wire or a silver wire. The thin metallic wire 40 preferably includes metallic silver, and may include metals other than the metallic silver, such as gold and copper. In addition, the thin metallic wire 40 preferably contains a polymer binder such as metallic silver and gelatin suitable for the formation of a mesh pattern.

The thin metallic wire 40 is not limited to a thin metallic wire made of a metal or an alloy described above. The thin metallic wire may include, for example, metal oxide particles, a metal paste such as a silver paste or a copper paste, and metal nanowire particles such as a silver nanowire or a copper nanowire.

The mesh patterns of the first detecting electrodes 32 and the second detecting electrodes 34 are not particularly limited, but preferably have a triangular shape such as an equilateral triangle, an isosceles triangle, or a right triangle, a quadrangular shape such as a square, a rectangle, a rhombus, a parallelogram, or a trapezoid, a polygonal shape such as a hexagon or an octagon, a circle, an ellipse, a star, or a geometric shape formed by combining the above shapes. The mesh pattern is formed by combining a large number of cells formed in a lattice shape by thin metallic wires. Specifically, as illustrated in FIG. 5, a pattern in which a plurality of square lattices formed by intersecting thin metallic wires 40 formed on the same surface of a transparent substrate are combined is intended. The mesh pattern may be formed by combining lattices having similar shapes or congruent shapes, or by combining lattices having different shapes. The length of one side of a lattice is not particularly limited, but preferably 50 to 500 μm, and more preferably 150 to 300 μm since the pattern is hardly visually recognized. In a case where the length of a side of a unit lattice is within the above range, it is possible to maintain good transparency, and in a case where the mesh pattern is installed on a front surface of display equipment, it is possible to visually recognize the display without an uncomfortable feeling.

The mesh patterns of the first detecting electrodes 32 and the second detecting electrodes 34 may be formed by combining curves. For example, a combination of circular arcs may be provided to form circular or elliptical lattice-like cells. As the circular arc, for example, a circular arc of 90° or a circular arc of 180° can be used.

The mesh patterns of the first detecting electrodes 32 and the second detecting electrodes 34 may be random patterns. The random pattern is, for example, a pattern obtained by randomly combining different kinds of polygons having different sizes. Moreover, the random pattern is, for example, a pattern in which at least one of the arrangement pitch, the angle, the length, or the shape is not constant with respect to the polygons constituting the pattern. Here, the polygon may be substantially polygonal, and some or all of the sides may be curved.

In this case, for example, the random pattern is a pattern in which angles are preserved with respect to the regular rhombus shapes, irregularity is imparted to the pitch, and openings have a parallelogram shape. The random pattern may be a pattern in which openings have a rhombus shape and irregularity is imparted to the angle with respect to the angles of the rhombus shape. The distribution of irregularity may be a normal distribution or a uniform distribution.

Next, a method of forming a thin metallic wire 40 will be described. The method of forming a thin metallic wire 40 is not particularly limited as long as it can be formed on the transparent substrates 30 and 31. As the method of forming a thin metallic wire 40, for example, a plating method, a silver salt method, a vapor deposition method, a printing method, or the like can be properly used.

A method of forming a thin metallic wire 40 through a plating method will be described. For example, the thin metallic wire 40 can be formed of a metal plating film which is formed on an electroless plating base layer by performing electroless plating on the base layer. In this case, a catalyst ink containing at least fine metal particles is formed in a pattern on a base material, and then the base material is dipped in an electroless plating bath to form a metal plating film. More specifically, a method of manufacturing a metal-coated base material described in JP2014-159620A can be used. In addition, a resin composition having at least a functional group capable of interacting with a metal catalyst precursor is formed in a pattern on a base material, and then a catalyst or a catalytic precursor is applied and the base material is dipped in an electroless plating bath to form a metal plating film. More specifically, a method of manufacturing a metal-coated base material described in JP2012-144761A can be applied.

A method of forming a thin metallic wire 40 through a silver salt method will be described. First, an exposure treatment is performed on a silver salt emulsion layer containing silver halide with the use of an exposure pattern to be the thin metallic wire 40, and then a development treatment is performed. Thus, the thin metallic wire 40 can be formed. More specifically, a method of manufacturing a thin metallic wire described in JP2015-022397A can be used.

A method of forming a thin metallic wire 40 through a vapor deposition method will be described. First, a copper foil layer is formed by vapor deposition, and a copper wire is formed from the copper foil layer through a photolithographic method. Thus, the thin metallic wire 40 can be formed. As the copper foil layer, electrolytic copper foil can be used other than deposition copper foil. More specifically, a step of forming a copper wire described in JP2014-029614A can be used.

A method of forming a thin metallic wire 40 through a printing method will be described. First, a conductive paste containing a conductive powder is applied to a substrate in the same pattern as the thin metallic wire 40, and then a heating treatment is performed thereon. Thus, the thin metallic wire 40 can be formed. The pattern formation using a conductive paste is performed through, for example, an inkjet method or a screen printing method. As the conductive paste, more specifically, a conductive paste described in JP2011-028985A can be used.

Basically, the invention is constituted as above. The conductive film and the touch panel according to the embodiment of the invention have been described in detail, but the invention is not limited to the above-described embodiments. Needless to say, various modifications or changes may be made without departing from the gist of the invention.

EXAMPLES

Hereinafter, characteristics of the invention will be described in more detail with examples. The materials, reagents, amounts, substance amounts, ratios, treatment contents, treatment procedures, and the like shown in the following examples can be properly changed without departing from the intent of the invention. Accordingly, the scope of the invention is not restrictively interpreted by the following specific examples.

First Example

In First Example, a mesh pattern formed of thin metallic wires whose wire width was continuously changed in a boundary region was produced by a design of drawing wire width in an exposure mask, and a conductive film was obtained. Using a liquid crystal display device having a quadrangular display region having a size of 12 inches, a touch panel matching the display region was produced and laminated on the liquid crystal display device to produce a touch panel module. In First Example, the boundary region was provided at all sides, that is, at four sides of the quadrangular image display region. There is a boundary region at an edge portion of the image display region.

Regarding the touch panel module, Examples 1 to 13, 21 to 33, and 41 to 53, and Comparative Examples 1, 2, and 3 in which the widths of thin metallic wires were changed, were produced, and image quality and resistance were evaluated. Evaluation results are shown in the following Table 1. The touch panel module will be described below.

<Production of Touch Panel Module for Evaluation>

The produced conductive film was laminated such that a liquid crystal display device, an optically transparent adhesive (OCA, 8146-2 (product number) manufactured by 3M), each conductive film, an optically transparent adhesive (OCA. 8146-3 (product number) manufactured by 3M), and a cover glass were laminated in this order to prepare a touch panel module.

<Image Quality Evaluation>

Regarding the produced touch panel module, 10 observers observed display image quality in a state in which a specific image was displayed. The observers compared the center portion and the edge portion of the image display region, and rated the degree of image quality degradation at the edge portion from 1 to 10 to determine the evaluation grade from AAA to C as follows according to the average made by the 10 observers. In a case where the evaluation grade was any one of AAA, AA, A, or B, it was judged that there was no substantial image quality degradation. In a case where the image quality evaluation grade was any one of A, AA, or AAA, the image quality was judged to be good.

In the rating from 1 to 10 for image quality evaluation, it was also possible to give an intermediate grade such as 4 or 7.

Greater than 8 and not greater than 10: No image quality degradation of the edge portion is recognized even in a case where the observer looks the edge portion closely.

Greater than 5 and not greater than 8: Image quality degradation of the edge portion is hardly recognized, and thus not realized even in a case where the observer looks the edge portion closely.

Greater than 3 and not greater than 5: Image quality degradation of the edge portion is recognized in a case where the observer looks the edge portion closely. However, it is hardly realized.

Greater than 1 and not greater than 3: Image quality degradation of the edge portion is recognized in a case where the observer looks the edge portion closely, and it is realized sometimes.

Not greater than 1: Image quality degradation of the edge portion is recognized at first sight and realized considerably.

AAA: The average is 9 or greater.
AA: The average is 8 or greater and less than 9.
A: The average is 6.5 or greater and less than 8.
B: The average is 5 or greater and less than 6.5.
C: The average is less than 5.

<Resistance Value Evaluation>

A resistance value Rb of the mesh pattern in a case where a boundary region was present was compared with a resistance value R0 of the mesh pattern in a case where no boundary region was present. The evaluation grade was determined from AAA to C according to the ratio of the resistance value Rb to the resistance value R0, that is, the value of Rh/R0. In a case where Rh/R0 was less than 98%, that is, the evaluation grade was any one of AAA, AA, A, or B as follows, the resistance value of the mesh pattern formed of thin metallic wires was judged to be able to be reduced by improving the pattern. In a case where the resistance value evaluation grade was any one of A, AA, or AAA, the resistance reduction effect was judged to be high.

Both the resistance value Rb and the resistance value R0 are values measured using a tester.

AAA: Rb/R0 is less than 90%.
AA: Rb/R0 is 90% or greater and less than 93%.
A: Rb/R0 is 93% or greater and less than 96%.
B: Rb/R0 is 96% or greater and less than 98%.
C: Rb/R0 is 98% or greater.

Hereinafter, a method of producing a conductive film 10 will be described.

<Method of Producing Conductive Film>

(Preparation of Silver Halide Emulsion)

To the following liquid 1 kept at a temperature of 38° C. and pH (potential of hydrogen) 4.5, the following liquids 2 and 3 were added for 20 minutes simultaneously with stirring of 90% of the liquid 2 and 90% of the liquid 3, and thus nuclear particles of 0.16 μm were formed. Next, the following liquids 4 and 5 were added for 8 minutes, and the remaining 10% of the following liquid 2 and the remaining 10% of the following liquid 3 were added for 2 minutes to grow the particles to 0.21 μm. 0.15 g of potassium iodide was further added, aging was performed for 5 minutes, and the formation of the particles was terminated.

| | |
|---|---|
| Liquid 1: | |
| Water | 750 ml |
| Gelatin | 9 g |
| Sodium Chloride | 3 g |
| 1,3-Dimethylimidazolidine-2-Thione | 20 mg |
| Sodium Benzenethiolsulfonate | 10 mg |
| Citric Acid | 0.7 g |
| Liquid 2: | |
| Water | 300 ml |
| Silver Nitrate | 150 g |
| Liquid 3: | |
| Water | 300 ml |
| Sodium Chloride | 38 g |
| Potassium Bromide | 32 g |
| Potassium Hexachloroiridate (III) (0.005% KCl, 20% aqueous solution) | 8 ml |
| Ammonium Hexachlorinated Rhodiumate (0.001% NaCl, 20% aqueous solution) | 10 ml |
| Liquid 4: | |
| Water | 100 ml |
| Silver Nitrate | 50 g |
| Liquid 5: | |
| Water | 100 ml |
| Sodium Chloride | 13 g |
| Potassium Bromide | 11 g |
| Yellow Prussiate of Potash | 5 mg |

Then, water washing was performed in the usual manner by a flocculation method. Specifically, the temperature was reduced to 35° C., and using a sulfuric acid, the pH was reduced (pH 3.6±0.2) until the silver halide was precipitated. Next, about 3 L of the supernatant liquid was removed (first water washing). 3 L of distilled water was further added, and then a sulfuric acid was added until the silver halide was precipitated. 3 L of the supernatant liquid was removed once again (second water washing). The same operation as the second water washing was repeated one time (third water washing), and the water washing and desalting step was terminated. The emulsion after the water washing and desalting was adjusted to pH 6.4 and pAg 7.5. 3.9 g of gelatin, 10 mg of sodium benzenethiolsulfonate, 3 mg of sodium benzenethiolsulfonate, 15 mg of sodium thiosulfate, and 10 mg of a chlorauric acid were added to conduct chemical sensitization so as to obtain optimum sensitivity at 55° C., and 100 mg of 1,3,3a,7-tetraazaindene as a stabilizer and 100 mg of PROXEL (trade name, manufactured by ICI Co., Ltd.) as a preservative were added. The finally obtained emulsion was a cubic silver iodochlorobromide particle emulsion containing 0.08 mol % of silver iodide, containing 70 mol % of silver chloride and 30 mol % of silver bromide in terms of silver chlorobromide ratio, and having an average particle size of 0.22 μm and a coefficient of variation of 9%.

(Preparation of Photosensitive Layer Forming Composition)

$1.2 \times 10^{-4}$ mol/mol Ag of 1,3,3a,7-tetraazaindene, $1.2 \times 10^{-2}$ mol/mol Ag of hydroquinone, $3.0 \times 10^{-4}$ mol/mol Ag of a citric acid, 0.90 g/mol Ag of 2,4-dichloro-6-hydroxy-1,3, 5-triazine sodium salt, and a small amount of a hardening agent were added to the above-described emulsion, and the pH of the liquid to be applied was adjusted to 5.6 using a citric acid. Mol/mol Ag represents the number of moles with respect to 1 mol of silver.

To the above-described liquid to be applied, a polymer represented by (P-1) and a polymer latex (mass ratio of dispersant/polymer: 2.0/100=0.02) containing a dispersant consisting of dialkylphenyl PEO sulfate were added such that the ratio (mass ratio) of polymer/gelatin contained was 0.5/1.

EPDXY RESIN DY 022 (trade name: manufactured by Nagase ChemteX Corporation) was farther added as a crosslinking agent. The amount of the crosslinking agent to be added was adjusted such that the amount of the crosslinking agent in a photosensitive layer to be described later was 0.09 g/m².

In this manner, a photosensitive layer forming composition was prepared.

The above-described polymer represented by (P-1) was synthesized with reference to JP3305459B and JP3754745B.

(Photosensitive Layer Forming Step)

The above-described polymer latex was applied to both surfaces of a transparent substrate 30 to provide an undercoat layer having a thickness of 0.05 μm. A polyethylene terephthalate (PET) film (manufactured by FUJIFILM Corporation) of 100 μm was used as the transparent substrate 30.

Next, an antihalation layer formed of a mixture of the above-described polymer latex, gelatin, and a dye, which has an optical density of about 1.0 and is decolored by an alkali in a developer, was provided on the undercoat layer. The mixing mass ratio of the polymer to gelatin (polymer/gelatin) was 2/1, and the content of the polymer was 0.65 g/m².

The above-described photosensitive layer forming composition was applied to the above-described antihalation layer, and a composition obtained by mixing the above-described polymer latex, gelatin, EPOCROS K-2020E (trade name: manufactured by NIPPON SHOKUBAI CO., LTD., oxazoline-based crosslinking reactive polymer latex (crosslinking group: oxazoline group)), and SNOWTEX C (registered trademark, trade name: manufactured by NISSAN CHEMICAL INDUSTRIES. LTD., colloidal silica) such that the solid content mass ratio (polymer/gelatin/EPOCROS K-2020E/SNOWTEX C (registered trademark)) was 1/1/0.3/2 was further applied such that the gelatin amount was 0.08 g/m². Thus, a support in which a photosensitive layer was formed on both surfaces was obtained. The support in which a photosensitive layer was formed on both surfaces is set as a film A. In the formed photosensitive layer, the silver amount was 6.2 g/m², and the gelatin amount was 1.0 g/m².

(Exposure Development Step)

Photo masks each having a mesh pattern illustrated in FIG. 5 were prepared. A photo mask having a mesh pattern was disposed on both surfaces of the above-described film A, and exposure was performed using parallel light from a high-pressure mercury lamp as a light source.

After the exposure, development was performed using the following developer, and a fixer (trade name: N3X-R for CN16X, manufactured by FUJIFILM Corporation) was used to perform the development treatment. Furthermore, rinsing with pure water and drying were performed, and thus a support in which a functional pattern formed of thin Ag (silver) wires, a pattern for thickness adjustment formed of thin Ag wires, and a gelatin layer were formed on both surfaces was obtained. The gelatin layer was formed between the thin Ag wires. The obtained film is set as a film B.

(Composition of Developer)

The following compounds are contained in 1 L of a developer 1.

| | |
|---|---|
| Hydroquinone | 0.037 mol/L |
| N-Methylaminophenol | 0.016 mol/L |
| Sodium Metaborate | 0.140 mol/L |
| Sodium Hydroxide | 0.360 mol/L |
| Sodium Bromide | 0.031 mol/L |
| Potassium Metabisulfite | 0.187 mol/L |

(Gelatin Decomposition Treatment)

The film B was dipped for 120 seconds in an aqueous solution (concentration of proteolytic enzyme: 0.5 mass %, liquid temperature: 40° C.) of proteolytic enzyme (BIOPRASE AL-15FG manufactured by Nagase ChemteX Corporation). The film B was taken out of the aqueous solution, and dipped for 120 seconds in warm water (liquid temperature: 50° C.) for washing. The film after the gelatin decomposition treatment is set as a film C.

(Resistance Reducing Treatment)

A calendaring treatment was performed with a pressure of 30 kN on the above-described film C using a calendaring device formed of a metal roller. In this case, two PET films having a roughened surface shape with line roughness Ra of 0.2 μm and Sm of 1.9 μm (measured by a shape analysis laser microscope VK-X110 manufactured by KEYENCE CORPORATION (JIS-B-0601-1994)) were transported together such that the roughened surfaces thereof faced a front surface and a rear surface of the above-described film C, and the roughened surface shape was transferred and formed on the front surface and the rear surface of the above-described film C.

After the above-described calendaring treatment, a heating treatment was performed by passing for 120 seconds through a superheated steam tank at a temperature of 150° C. The film after the heating treatment is set as a film D. The film D is a conductive film.

Next, Examples 1 to 13, 21 to 33, and 41 to 53, and Comparative Examples 1, 2, and 3 will be described.

Dimensions of components of conductive films of Examples 1 to 13, 21 to 33, and 41 to 53, and Comparative Examples 1, 2, and 3 were as shown in the following Table 1. The wire width of a thin metallic wire was adjusted by adjusting a width of a pattern corresponding to the thin metallic wires in an exposure mask, an exposure amount, an exposure wavelength, a developer, a development time, and a development temperature condition so as to obtain a predetermined wire width. The exposure amount includes exposure illuminance and exposure time.

Example 1

In Example 1, the reference wire width W0 of a thin metallic wire was 4.0 μm, the largest wire width Wmax (hereinafter, referred to as maximum wire width Wmax) was 4.36 μm, and the range L of a boundary region was 3.50 cm. The range L of a boundary region and the wire width change region Dc (see FIG. 5) were the same.

Example 2

In Example 2, the reference wire width W0 of a thin metallic wire was 4.0 μm, the maximum wire width Wmax was 12.0 μm, and the range L of a boundary region was 2.00 cm.

Example 3

In Example 3, the reference wire width $W_0$ of a thin metallic wire was 4.0 μm, the maximum wire width Wmax was 5.6 μm, and the range L of a boundary region was 2.00 cm.

Example 4

In Example 4, the reference wire width $W_0$ of a thin metallic wire was 4.0 μm, the maximum wire width Wmax was 7.2 μm, and the range L of a boundary region was 1.00 cm.

Example 5

In Example 5, the reference wire width $W_0$ of a thin metallic wire was 4.0 μm, the maximum wire width Wmax was 8.0 μm, and the range L of a boundary region was 1.00 cm.

Example 6

In Example 6, the reference wire width $W_0$ of a thin metallic wire was 4.0 μm, the maximum wire width Wmax was 10.0 μm, and the range L of a boundary region was 1.25 cm.

Example 7

In Example 7, the reference wire width $W_0$ of a thin metallic wire was 4.0 μm, the maximum wire width Wmax was 8.0 μm, and the range L of a boundary region was 2.00 cm.

Example 8

In Example 8, the reference wire width $W_0$ of a thin metallic wire was 4.0 μm, the maximum wire width Wmax was 12.0 μm, and the range L of a boundary region was 1.50 cm.

Example 9

In Example 9, the reference wire width $W_0$ of a thin metallic wire was 4.0 μm, the maximum wire width Wmax was 7.2 μm, and the range L of a boundary region was 2.00 cm.

Example 10

In Example 10, the reference wire width $W_0$ of a thin metallic wire was 4.0 μm, the maximum wire width Wmax was 8.0 μm, and the range L of a boundary region was 1.34 cm.

Example 11

In Example 11, the reference wire width $W_0$ of a thin metallic wire was 4.0 μm, the maximum wire width Wmax was 7.2 μm, and the range L of a boundary region was 1.20 cm.

Example 12

In Example 12, the reference wire width $W_0$ of a thin metallic wire was 4.0 μm, the maximum wire width Wmax was 7.2 μm, and the range L of a boundary region was 1.00 cm.

Example 13

In Example 13, the reference wire width $W_0$ of a thin metallic wire was 4.0 μm, the maximum wire width Wmax was 8.0 μm, and the range L of a boundary region was 2.20 cm.

Comparative Example 1

In Comparative Example 1, thin metallic wires had no change in wire width. The wire width of a thin metallic wire was 4.0 μm. In Comparative Example 1, both the reference wire width $W_0$ and the maximum wire width Wmax were 4.0 μm.

Example 21

In Example 21, the reference wire width $W_0$ of a thin metallic wire was 3.0 μm, the maximum wire width Wmax was 3.27 μm, and the range L of a boundary region was 3.50 cm.

Example 22

In Example 22, the reference wire width $W_0$ of a thin metallic wire was 3.0 μm, the maximum wire width Wmax was 9.0 μm, and the range L of a boundary region was 2.00 cm.

Example 23

In Example 23, the reference wire width $W_0$ of a thin metallic wire was 3.0 μm, the maximum wire width Wmax was 4.2 μm, and the range L of a boundary region was 2.00 cm.

Example 24

In Example 24, the reference wire width $W_0$ of a thin metallic wire was 3.0 μm, the maximum wire width Wmax was 5.4 μm, and the range L of a boundary region was 1.00 cm.

Example 25

In Example 25, the reference wire width $W_0$ of a thin metallic wire was 3.0 μm, the maximum wire width Wmax was 6.0 μm, and the range L of a boundary region was 1.00 cm.

Example 26

In Example 26, the reference wire width $W_0$ of a thin metallic wire was 3.0 μm, the maximum wire width Wmax was 7.5 μm, and the range L of a boundary region was 1.25 cm.

Example 27

In Example 27, the reference wire width $W_0$ of a thin metallic wire was 3.0 μm, the maximum wire width Wmax was 6.0 μm, and the range L of a boundary region was 2.00 cm.

Example 28

In Example 28, the reference wire width $W_0$ of a thin metallic wire was 3.0 μm, the maximum wire width Wmax was 9.0 μm, and the range L of a boundary region was 1.50 cm.

Example 29

In Example 29, the reference wire width $W_0$ of a thin metallic wire was 3.0 μm, the maximum wire width Wmax was 5.4 μm, and the range L of a boundary region was 2.00 cm.

Example 30

In Example 30, the reference wire width $W_0$ of a thin metallic wire was 3.0 μm, the maximum wire width Wmax was 6.0 μm, and the range L of a boundary region was 1.34 cm.

Example 31

In Example 31, the reference wire width $W_0$ of a thin metallic wire was 3.0 μm, the maximum wire width Wmax was 5.4 μm, and the range L of a boundary region was 1.20 cm.

Example 32

In Example 32, the reference wire width $W_0$ of a thin metallic wire was 3.0 μm, the maximum wire width Wmax was 5.4 μm, and the range L of a boundary region was 1.00 cm.

Example 33

In Example 33, the reference wire width $W_0$ of a thin metallic wire was 3.0 μm, the maximum wire width Wmax was 6.0 μm, and the range L of a boundary region was 2.20 cm.

Comparative Example 2

In Comparative Example 2, thin metallic wires had no change in wire width. The wire width of a thin metallic wire was 3.0 μm. In Comparative Example 2, both the reference wire width $W_0$ and the maximum wire width Wmax were 3.0 μm.

Example 41

In Example 41, the reference wire width $W_0$ of a thin metallic wire was 2.5 μm, the maximum wire width Wmax was 2.73 μm, and the range L of a boundary region was 3.50 cm.

Example 42

In Example 42, the reference wire width $W_0$ of a thin metallic wire was 2.5 μm, the maximum wire width Wmax was 7.5 μm, and the range L of a boundary region was 2.00 cm.

Example 43

In Example 43, the reference wire width $W_0$ of a thin metallic wire was 2.5 μm, the maximum wire width Wmax was 3.5 μm, and the range L of a boundary region was 2.00 cm.

Example 44

In Example 44, the reference wire width $W_0$ of a thin metallic wire was 2.5 μm, the maximum wire width Wmax was 4.5 μm, and the range L of a boundary region was 1.00 cm.

Example 45

In Example 45, the reference wire width $W_0$ of a thin metallic wire was 2.5 μm, the maximum wire width Wmax was 5.0 μm, and the range L of a boundary region was 1.00 cm.

Example 46

In Example 46, the reference wire width $W_0$ of a thin metallic wire was 2.5 μm, the maximum wire width Wmax was 6.3 μm, and the range L of a boundary region was 1.25 cm.

Example 47

In Example 47, the reference wire width $W_0$ of a thin metallic wire was 2.5 μm, the maximum wire width Wmax was 5.0 μm, and the range L of a boundary region was 2.00 cm.

Example 48

In Example 48, the reference wire width $W_0$ of a thin metallic wire was 2.5 μm, the maximum wire width Wmax was 7.5 μm, and the range L of a boundary region was 1.50 cm.

Example 49

In Example 49, the reference wire width $W_0$ of a thin metallic wire was 2.5 μm, the maximum wire width Wmax was 4.5 μm, and the range L of a boundary region was 2.00 cm.

Example 50

In Example 50, the reference wire width $W_0$ of a thin metallic wire was 2.5 μm, the maximum wire width Wmax was 5.0 μm, and the range L of a boundary region was 1.34 cm.

Example 51

In Example 51, the reference wire width W0 of a thin metallic wire was 2.5 μm, the maximum wire width Wmax was 4.5 μm, and the range L of a boundary region was 1.20 cm.

Example 52

In Example 52, the reference wire width W0 of a thin metallic wire was 2.5 μm, the maximum wire width Wmax was 4.5 μm, and the range L of a boundary region was 1.00 cm.

Example 53

In Example 53, the reference wire width W0 of a thin metallic wire was 2.5 μm, the maximum wire width Wmax was 5.0 μm, and the range L of a boundary region was 2.20 cm.

Comparative Example 3

In Comparative Example 3, thin metallic wires had no change in wire width. The wire width of a thin metallic wire was 2.5 μm. In Comparative Example 3, both the reference wire width W0 and the maximum wire width Wmax were 2.5 μm.

In the following Table 1, P1 represents the value of $0.5 \times W_{max}/W_0$, and P2 represents the value of $4.77 \times (W_{max}/W_0) - 4.19$. The symbol "–" represents zero.

TABLE 1

| | W0 [μm] | Wmax [μm] | L [cm] | Wmax/W0 | Y [/cm] | P1 | P2 | Image Quality Evaluation | Resistance Evaluation |
|---|---|---|---|---|---|---|---|---|---|
| Example 1 | 4.0 | 4.36 | 3.50 | 1.09 | 0.31 | 0.55 | 0.29 | B | B |
| Example 2 | 4.0 | 12.0 | 2.00 | 3.0 | 1.50 | 1.50 | 9.40 | B | AA |
| Example 3 | 4.0 | 5.6 | 2.00 | 1.4 | 0.70 | 0.70 | 1.77 | AAA | A |
| Example 4 | 4.0 | 7.2 | 1.00 | 1.8 | 1.80 | 0.90 | 3.68 | A | A |
| Example 5 | 4.0 | 8.0 | 1.00 | 2.0 | 2.00 | 1.00 | 4.63 | A | A |
| Example 6 | 4.0 | 10.0 | 1.25 | 2.5 | 2.00 | 1.25 | 7.02 | A | AA |
| Example 7 | 4.0 | 8.0 | 2.00 | 2.0 | 1.00 | 1.00 | 4.63 | AAA | AA |
| Example 8 | 4.0 | 12.0 | 1.50 | 3.0 | 2.00 | 1.50 | 9.40 | B | AA |
| Example 9 | 4.0 | 7.2 | 2.00 | 1.8 | 0.90 | 0.90 | 3.68 | AAA | A |
| Example 10 | 4.0 | 8.0 | 1.34 | 2.0 | 1.49 | 1.00 | 4.63 | AA | A |
| Example 11 | 4.0 | 7.2 | 1.20 | 1.8 | 1.50 | 0.90 | 3.68 | AA | A |
| Example 12 | 4.0 | 7.2 | 1.00 | 1.8 | 1.80 | 0.90 | 3.68 | A | A |
| Example 13 | 4.0 | 8.0 | 2.20 | 2.0 | 0.91 | 1.00 | 4.63 | B | AA |
| Comparative Example 1 | 4.0 | 4.0 | — | 1.0 | — | — | — | AAA | C |
| Example 21 | 3.0 | 3.27 | 3.50 | 1.09 | 0.31 | 0.55 | 0.29 | B | B |
| Example 22 | 3.0 | 9.0 | 2.00 | 3.0 | 1.50 | 1.50 | 9.40 | B | AA |
| Example 23 | 3.0 | 4.2 | 2.00 | 1.4 | 0.70 | 0.70 | 1.77 | AAA | A |
| Example 24 | 3.0 | 5.4 | 1.00 | 1.8 | 1.80 | 0.90 | 3.68 | A | A |
| Example 25 | 3.0 | 6.0 | 1.00 | 2.0 | 2.00 | 1.00 | 4.63 | A | A |
| Example 26 | 3.0 | 7.5 | 1.25 | 2.5 | 2.00 | 1.25 | 7.02 | A | AA |
| Example 27 | 3.0 | 6.0 | 2.00 | 2.0 | 1.00 | 1.00 | 4.63 | AAA | AA |
| Example 28 | 3.0 | 9.0 | 1.50 | 3.0 | 2.00 | 1.50 | 9.40 | B | AA |
| Example 29 | 3.0 | 5.4 | 2.00 | 1.8 | 0.90 | 0.90 | 3.68 | AAA | A |
| Example 30 | 3.0 | 6.0 | 1.34 | 2.0 | 1.49 | 1.00 | 4.63 | AA | A |
| Example 31 | 3.0 | 5.4 | 1.20 | 1.8 | 1.50 | 0.90 | 3.68 | AA | A |
| Example 32 | 3.0 | 5.4 | 1.00 | 1.8 | 1.80 | 0.90 | 3.68 | A | A |
| Example 33 | 3.0 | 6.0 | 2.20 | 2.0 | 0.91 | 1.00 | 4.63 | B | AA |
| Comparative Example 2 | 3.0 | 3.0 | — | 1.0 | — | — | — | AAA | C |
| Example 41 | 2.5 | 2.73 | 3.50 | 1.09 | 0.31 | 0.55 | 0.29 | B | B |
| Example 42 | 2.5 | 7.5 | 2.00 | 3.0 | 1.50 | 1.50 | 9.40 | B | AA |
| Example 43 | 2.5 | 3.5 | 2.00 | 1.4 | 0.70 | 0.70 | 1.77 | AAA | A |
| Example 44 | 2.5 | 4.5 | 1.00 | 1.8 | 1.80 | 0.90 | 3.68 | A | A |
| Example 45 | 2.5 | 5.0 | 1.00 | 2.0 | 2.00 | 1.00 | 4.63 | A | A |
| Example 46 | 2.5 | 6.3 | 1.25 | 2.5 | 2.00 | 1.25 | 7.02 | A | AA |
| Example 47 | 2.5 | 5.0 | 2.00 | 2.0 | 1.00 | 1.00 | 4.63 | AAA | AA |
| Example 48 | 2.5 | 7.5 | 1.50 | 3.0 | 2.00 | 1.50 | 9.40 | B | AA |
| Example 49 | 2.5 | 4.5 | 2.00 | 1.8 | 0.90 | 0.90 | 3.68 | AAA | A |
| Example 50 | 2.5 | 5.0 | 1.34 | 2.0 | 1.49 | 1.00 | 4.63 | AA | A |
| Example 51 | 2.5 | 4.5 | 1.20 | 1.8 | 1.50 | 0.90 | 3.68 | AA | A |
| Example 52 | 2.5 | 4.5 | 1.00 | 1.8 | 1.80 | 0.90 | 3.68 | A | A |
| Example 53 | 2.5 | 5.0 | 2.20 | 2.0 | 0.91 | 1.00 | 4.63 | B | AA |
| Comparative Example 3 | 2.5 | 2.5 | — | 1.0 | — | — | — | AAA | C |

As shown in Table 1, in each of Examples 1 to 13, 21 to 33, and 41 to 53, both the image quality evaluation grade and the resistance evaluation grade were "B" or higher, and it was possible to achieve both high image quality and low resistance. On the other hand, in Comparative Examples 1, 2, and 3, the resistance evaluation grade was low, and it was impossible to achieve both high image quality and low resistance.

In Examples 1 and 13 in which the length of the range L of a boundary region is greater than 2 cm, it is thought that the range of the boundary region is wide, and thus image quality degradation of the edge portion is easily observed through observer's eyes, and the image quality evaluation grade is "B".

In Examples 2 and 8 in which Wmax/W0 is greater than 2.5, it is thought that the change of the wire width is large, and thus the change is easily observed through observer's eyes, and the image quality evaluation grade is "B".

In a case where the reference wire width is 3.0 μm, in Examples 21 and 33 in which the length of the range L of a boundary region is greater than 2 cm, it is thought that the range of the boundary region is wide, and thus image quality degradation of the edge portion is easily observed through observer's eyes, and the image quality evaluation grade is "B".

In Examples 22 and 28 in which Wmax/W0 is greater than 2.5, it is thought that the change of the wire width is large, and thus the change is easily observed through observer's eyes, and the image quality evaluation grade is "B".

In a case where the reference wire width is 2.5 μm, in Examples 41 and 53 in which the length of the range L of a boundary region is greater than 2 cm, it is thought that the range of the boundary region is wide, and thus image quality degradation of the edge portion is easily observed through observer's eyes, and the image quality evaluation grade is "B".

In Examples 42 and 48 in which Wmax/W0 is greater than 2.5, it is thought that the change of the wire width is large, and thus the change is easily observed through observer's eyes, and the image quality evaluation grade is "B".

Second Example

Second Example was the same as the above-described First Example, except that the boundary region was provided at two sides of the quadrangular image display region opposed to each other. Therefore, detailed description of the configuration of the touch panel module, the method of manufacturing the touch panel module, and the evaluation method will be omitted.

In Second. Example, image quality and resistance were evaluated regarding the touch panel modules of Examples 61 to 73, 81 to 93, and 101 to 113, and Comparative Examples 4, 5, and 6. In Second Example, the boundary region is present at edge portions of two sides of the image display region opposed to each other.

Next, the touch panel modules of Examples 61 to 73, 81 to 93, and 101 to 113, and Comparative Examples 4, 5, and 6 will be described.

Dimensions of components of conductive films of Examples 61 to 73, 81 to 93, and 101 to 113, and Comparative Examples 4, 5, and 6 were as shown in the following Table 2. The wire width of a thin metallic wire was adjusted by adjusting a width of a pattern corresponding to the thin metallic wires in an exposure mask, an exposure amount, an exposure wavelength, a developer, a development time, and a development temperature condition so as to obtain a predetermined wire width. The exposure amount includes exposure illuminance and exposure time.

Example 61

In Example 61, the reference wire width W0 of a thin metallic wire was 4.0 μm, the maximum wire width Wmax was 4.36 μm, and the range L of a boundary region was 3.50 cm.

Example 62

In Example 62, the reference wire width W0 of a thin metallic wire was 4.0 μm, the maximum wire width Wmax was 12.0 μm, and the range L of a boundary region was 2.00 cm.

Example 63

In Example 63, the reference wire width W0 of a thin metallic wire was 4.0 μm, the maximum wire width Wmax was 5.6 μm, and the range L of a boundary region was 2.00 cm.

Example 64

In Example 64, the reference wire width W0 of a thin metallic wire was 4.0 μm, the maximum wire width Wmax was 7.2 μm, and the range L of a boundary region was 1.00 cm.

Example 65

In Example 65, the reference wire width W0 of a thin metallic wire was 4.0 μm, the maximum wire width Wmax was 8.0 μm, and the range L of a boundary region was 1.00 cm.

Example 66

In Example 66, the reference wire width W0 of a thin metallic wire was 4.0 μm, the maximum wire width Wmax was 10.0 μm, and the range L of a boundary region was 1.25 cm.

Example 67

In Example 67, the reference wire width W0 of a thin metallic wire was 4.0 μm, the maximum wire width Wmax was 8.0 μm, and the range L of a boundary region was 2.00 cm.

Example 68

In Example 68, the reference wire width W0 of a thin metallic wire was 4.0 μm, the maximum wire width Wmax was 12.0 μm, and the range L of a boundary region was 1.50 cm.

Example 69

In Example 69, the reference wire width W0 of a thin metallic wire was 4.0 μm, the maximum wire width Wmax was 7.2 μm, and the range L of a boundary region was 2.00 cm.

Example 70

In Example 70, the reference wire width $W_0$ of a thin metallic wire was 4.0 μm, the maximum wire width Wmax was 8.0 μm, and the range L of a boundary region was 1.34 cm.

Example 71

In Example 71, the reference wire width $W_0$ of a thin metallic wire was 4.0 μm, the maximum wire width Wmax was 7.2 μm, and the range L of a boundary region was 1.20 cm.

Example 72

In Example 72, the reference wire width $W_0$ of a thin metallic wire was 4.0 μm, the maximum wire width Wmax was 7.2 μm, and the range L of a boundary region was 1.00 cm.

Example 73

In Example 73, the reference wire width $W_0$ of a thin metallic wire was 4.0 μm, the maximum wire width Wmax was 8.0 μm, and the range L of a boundary region was 2.20 cm.

Comparative Example 4

In Comparative Example 4, thin metallic wires had no change in wire width. The wire width of a thin metallic wire was 4.0 μm. In Comparative Example 4, both the reference wire width $W_0$ and the maximum wire width Wmax were 4.0 μm.

Example 81

In Example 81, the reference wire width $W_0$ of a thin metallic wire was 3.0 μm, the maximum wire width Wmax was 3.27 μm, and the range L of a boundary region was 3.50 cm.

Example 82

In Example 82, the reference wire width $W_0$ of a thin metallic wire was 3.0 μm, the maximum wire width Wmax was 9.0 μm, and the range L of a boundary region was 2.00 cm.

Example 83

In Example 83, the reference wire width $W_0$ of a thin metallic wire was 3.0 μm, the maximum wire width Wmax was 4.2 and the range L of a boundary region was 2.00 cm.

Example 84

In Example 84, the reference wire width $W_0$ of a thin metallic wire was 3.0 μm, the maximum wire width Wmax was 5.4 μm, and the range L of a boundary region was 1.00 cm.

Example 85

In Example 85, the reference wire width $W_0$ of a thin metallic wire was 3.0 μm, the maximum wire width Wmax was 6.0 μm, and the range L of a boundary region was 1.00 cm.

Example 86

In Example 86, the reference wire width $W_0$ of a thin metallic wire was 3.0 μm, the maximum wire width Wmax was 7.5 μm, and the range L of a boundary region was 1.25 cm.

Example 87

In Example 87, the reference wire width $W_0$ of a thin metallic wire was 3.0 μm, the maximum wire width Wmax was 6.0 μm, and the range L of a boundary region was 2.00 cm.

Example 88

In Example 88, the reference wire width $W_0$ of a thin metallic wire was 3.0 μm, the maximum wire width Wmax was 9.0 μm, and the range L of a boundary region was 1.50 cm.

Example 89

In Example 89, the reference wire width $W_0$ of a thin metallic wire was 3.0 μm, the maximum wire width Wmax was 5.4 μm, and the range L of a boundary region was 2.00 cm.

Example 90

In Example 90, the reference wire width $W_0$ of a thin metallic wire was 3.0 μm, the maximum wire width Wmax was 6.0 μm, and the range L of a boundary region was 1.34 cm.

Example 91

In Example 91, the reference wire width $W_0$ of a thin metallic wire was 3.0 μm, the maximum wire width Wmax was 5.4 μm, and the range L of a boundary region was 1.20 cm.

Example 92

In Example 92, the reference wire width $W_0$ of a thin metallic wire was 3.0 μm, the maximum wire width Wmax was 5.4 μm, and the range L of a boundary region was 1.00 cm.

Example 93

In Example 93, the reference wire width $W_0$ of a thin metallic wire was 3.0 μm, the maximum wire width Wmax was 6.0 μm, and the range L of a boundary region was 2.20 cm.

Comparative Example 5

In Comparative Example 5, thin metallic wires had no change in wire width. The wire width of a thin metallic wire was 3.0 µm. In Comparative Example 5, both the reference wire width W0 and the maximum wire width Wmax were 3.0 µm.

Example 101

In Example 101, the reference wire width W0 of a thin metallic wire was 2.5 µm, the maximum wire width Wmax was 2.73 µm, and the range L of a boundary region was 3.50 cm.

Example 102

In Example 102, the reference wire width W0 of a thin metallic wire was 2.5 µm, the maximum wire width Wmax was 7.5 µm, and the range L of a boundary region was 2.00 cm.

Example 103

In Example 103, the reference wire width W0 of a thin metallic wire was 2.5 µm, the maximum wire width Wmax was 3.5 µm, and the range L of a boundary region was 2.00 cm.

Example 104

In Example 104, the reference wire width W0 of a thin metallic wire was 2.5 µm, the maximum wire width Wmax was 4.5 µm, and the range L of a boundary region was 1.00 cm.

Example 105

In Example 105, the reference wire width W0 of a thin metallic wire was 2.5 µm, the maximum wire width Wmax was 5.0 µm, and the range L of a boundary region was 1.00 cm.

Example 106

In Example 106, the reference wire width W0 of a thin metallic wire was 2.5 µm, the maximum wire width Wmax was 6.3 µm, and the range L of a boundary region was 1.25 cm.

Example 107

In Example 107, the reference wire width W0 of a thin metallic wire was 2.5 µm, the maximum wire width Wmax was 5.0 µm, and the range L of a boundary region was 2.00 cm.

Example 108

In Example 108, the reference wire width W0 of a thin metallic wire was 2.5 µm, the maximum wire width Wmax was 7.5 µm, and the range L of a boundary region was 1.50 cm.

Example 109

In Example 109, the reference wire width W0 of a thin metallic wire was 2.5 µm, the maximum wire width Wmax was 4.5 µm, and the range L of a boundary region was 2.00 cm.

Example 110

In Example 110, the reference wire width W0 of a thin metallic wire was 2.5 µm, the maximum wire width Wmax was 5.0 µm, and the range L of a boundary region was 1.34 cm.

Example 111

In Example 111, the reference wire width W0 of a thin metallic wire was 2.5 µm, the maximum wire width Wmax was 4.5 µm, and the range L of a boundary region was 1.20 cm.

Example 112

In Example 112, the reference wire width W0 of a thin metallic wire was 2.5 µm, the maximum wire width Wmax was 4.5 µm, and the range L of a boundary region was 1.00 cm.

Example 113

In Example 113, the reference wire width W0 of a thin metallic wire was 2.5 µm, the maximum wire width Wmax was 5.0 µm, and the range L of a boundary region was 2.20 cm.

Comparative Example 6

In Comparative Example 6, thin metallic wires had no change in wire width. The wire width of a thin metallic wire was 2.5 µm. In Comparative Example 6, both the reference wire width W0 and the maximum wire width Wmax were 2.5 µm.

In the following Table 2, P1 represents the value of 0.5×Wmax/W0, and P2 represents the value of 4.77×(Wmax/W0)−4.19. The symbol "−" represents zero.

TABLE 2

|  | W0 [µm] | Wmax [µm] | L [cm] | Wmax/W0 | Y [/cm] | P1 | P2 | Image Quality Evaluation | Resistance Evaluation |
|---|---|---|---|---|---|---|---|---|---|
| Example 61 | 4.0 | 4.36 | 3.50 | 1.09 | 0.31 | 0.55 | 0.29 | B | B |
| Example 62 | 4.0 | 12.0 | 2.00 | 3.0 | 1.50 | 1.50 | 9.40 | B | AA |
| Example 63 | 4.0 | 5.6 | 2.00 | 1.4 | 0.70 | 0.70 | 1.77 | AAA | A |
| Example 64 | 4.0 | 7.2 | 1.00 | 1.8 | 1.80 | 0.90 | 3.68 | A | A |
| Example 65 | 4.0 | 8.0 | 1.00 | 2.0 | 2.00 | 1.00 | 4.63 | A | A |
| Example 66 | 4.0 | 10.0 | 1.25 | 2.5 | 2.00 | 1.25 | 7.02 | A | AA |
| Example 67 | 4.0 | 8.0 | 2.00 | 2.0 | 1.00 | 1.00 | 4.63 | AAA | AA |
| Example 68 | 4.0 | 12.0 | 1.50 | 3.0 | 2.00 | 1.50 | 9.40 | B | AA |
| Example 69 | 4.0 | 7.2 | 2.00 | 1.8 | 0.90 | 0.90 | 3.68 | AAA | A |
| Example 70 | 4.0 | 8.0 | 1.34 | 2.0 | 1.49 | 1.00 | 4.63 | AA | A |
| Example 71 | 4.0 | 7.2 | 1.20 | 1.8 | 1.50 | 0.90 | 3.68 | AA | A |
| Example 72 | 4.0 | 7.2 | 1.00 | 1.8 | 1.80 | 0.90 | 3.68 | A | A |

TABLE 2-continued

|  | W0 [μm] | Wmax [μm] | L [cm] | Wmax/W0 | Y [/cm] | P1 | P2 | Image Quality Evaluation | Resistance Evaluation |
|---|---|---|---|---|---|---|---|---|---|
| Example 73 | 4.0 | 8.0 | 2.20 | 2.0 | 0.91 | 1.00 | 4.63 | B | AA |
| Comparative Example 4 | 4.0 | 4.0 | — | 1.0 | — | — | — | AAA | C |
| Example 81 | 3.0 | 3.27 | 3.50 | 1.09 | 0.31 | 0.55 | 0.29 | B | B |
| Example 82 | 3.0 | 9.0 | 2.00 | 3.0 | 1.50 | 1.50 | 9.40 | B | AA |
| Example 83 | 3.0 | 4.2 | 2.00 | 1.4 | 0.70 | 0.70 | 1.77 | AAA | A |
| Example 84 | 3.0 | 5.4 | 1.00 | 1.8 | 1.80 | 0.90 | 3.68 | A | A |
| Example 85 | 3.0 | 6.0 | 1.00 | 2.0 | 2.00 | 1.00 | 4.63 | A | A |
| Example 86 | 3.0 | 7.5 | 1.25 | 2.5 | 2.00 | 1.25 | 7.02 | A | AA |
| Example 87 | 3.0 | 6.0 | 2.00 | 2.0 | 1.00 | 1.00 | 4.63 | AAA | AA |
| Example 88 | 3.0 | 9.0 | 1.50 | 3.0 | 2.00 | 1.50 | 9.40 | B | AA |
| Example 89 | 3.0 | 5.4 | 2.00 | 1.8 | 0.90 | 0.90 | 3.68 | AAA | A |
| Example 90 | 3.0 | 6.0 | 1.34 | 2.0 | 1.49 | 1.00 | 4.63 | AA | A |
| Example 91 | 3.0 | 5.4 | 1.20 | 1.8 | 1.50 | 0.90 | 3.68 | AA | A |
| Example 92 | 3.0 | 5.4 | 1.00 | 1.8 | 1.80 | 0.90 | 3.68 | A | A |
| Example 93 | 3.0 | 6.0 | 2.20 | 2.0 | 0.91 | 1.00 | 4.63 | B | AA |
| Comparative Example 5 | 3.0 | 3.0 | — | 1.0 | — | — | — | AAA | C |
| Example 101 | 2.5 | 2.73 | 3.50 | 1.09 | 0.31 | 0.55 | 0.29 | B | B |
| Example 102 | 2.5 | 7.5 | 2.00 | 3.0 | 1.50 | 1.50 | 9.40 | B | AA |
| Example 103 | 2.5 | 3.5 | 2.00 | 1.4 | 0.70 | 0.70 | 1.77 | AAA | A |
| Example 104 | 2.5 | 4.5 | 1.00 | 1.8 | 1.80 | 0.90 | 3.68 | A | A |
| Example 105 | 2.5 | 5.0 | 1.00 | 2.0 | 2.00 | 1.00 | 4.63 | A | A |
| Example 106 | 2.5 | 6.3 | 1.25 | 2.5 | 2.00 | 1.25 | 7.02 | A | AA |
| Example 107 | 2.5 | 5.0 | 2.00 | 2.0 | 1.00 | 1.00 | 4.63 | AAA | AA |
| Example 108 | 2.5 | 7.5 | 1.50 | 3.0 | 2.00 | 1.50 | 9.40 | B | AA |
| Example 109 | 2.5 | 4.5 | 2.00 | 1.8 | 0.90 | 0.90 | 3.68 | AAA | A |
| Example 110 | 2.5 | 5.0 | 1.34 | 2.0 | 1.49 | 1.00 | 4.63 | AA | A |
| Example 111 | 2.5 | 4.5 | 1.20 | 1.8 | 1.50 | 0.90 | 3.68 | AA | A |
| Example 112 | 2.5 | 4.5 | 1.00 | 1.8 | 1.80 | 0.90 | 3.68 | A | A |
| Example 113 | 2.5 | 5.0 | 2.20 | 2.0 | 0.91 | 1.00 | 4.63 | B | AA |
| Comparative Example 6 | 2.5 | 2.5 | — | 1.0 | — | — | — | AAA | C |

As shown in Table 2, in each of Examples 61 to 73, 81 to 93, and 101 to 113, both the image quality evaluation grade and the resistance evaluation grade were "B" or higher, and it was possible to achieve both high image quality and low resistance. On the other hand, in Comparative Examples 4, 5, and 6, the resistance evaluation grade was low, and it was impossible to achieve both high image quality and low resistance.

In Examples 61 and 73 in which the length of the range L of a boundary region is greater than 2 cm, it is thought that the range of the boundary region is wide, and thus image quality degradation of the edge portion is easily observed through observer's eyes, and the image quality evaluation grade is "B".

In Examples 62 and 68 in which Wmax/W0 is greater than 2.5, it is thought that the change of the wire width is large, and thus the change is easily observed through observer's eyes, and the image quality evaluation grade is "B".

In a case where the reference wire width is 3.0 μm, in Examples 81 and 93 in which the length of the range L of a boundary region is greater than 2 cm, it is thought that the range of the boundary region is wide, and thus image quality degradation of the edge portion is easily observed through observer's eyes, and the image quality evaluation grade is "B".

In Examples 82 and 88 in which Wmax/W0 is greater than 2.5, it is thought that the change of the wire width is large, and thus the change is easily observed through observer's eyes, and the image quality evaluation grade is "B".

In a case where the reference wire width is 2.5 μm, in Examples 101 and 113 in which the length of the range L of a boundary region is greater than 2 cm, it is thought that the range of the boundary region is wide, and thus image quality degradation of the edge portion is easily observed through observer's eyes, and the image quality evaluation grade is "B".

In Examples 102 and 108 in which Wmax/W0 is greater than 2.5, it is thought that the change of the wire width is large, and thus the change is easily observed through observer's eyes, and the image quality evaluation grade is "B".

Third Example

Third Example was the same as the above-described First Example, except that the boundary region was provided at one side of the quadrangular image display region. Therefore, detailed description of the configuration of the touch panel module, the method of manufacturing the touch panel module, and the evaluation method will be omitted.

In Third Example, image quality and resistance were evaluated regarding the touch panel modules of Examples 121 to 133, 141 to 153, and 161 to 173, and Comparative Examples 7, 8, and 9. In Third Example, the boundary region is present at an edge portion of one side of the image display region.

Next, the touch panel modules of Examples 121 to 133, 141 to 153, and 161 to 173, and Comparative Examples 7, 8, and 9 will be described.

Dimensions of components of conductive films of Examples 121 to 133, 141 to 153, and 161 to 173, and Comparative Examples 7, 8, and 9 were as shown in the following Table 3. The wire width of a thin metallic wire was adjusted by adjusting a width of a pattern corresponding to the thin metallic wires in an exposure mask, an exposure amount, an exposure wavelength, a developer, a development time, and a development temperature condition so as to obtain a predetermined wire width. The exposure amount includes exposure illuminance and exposure time.

Example 121

In Example 121, the reference wire width W0 of a thin metallic wire was 4.0 μm, the maximum wire width Wmax was 4.36 μm, and the range L of a boundary region was 3.50 cm.

Example 122

In Example 122, the reference wire width W0 of a thin metallic wire was 4.0 μm, the maximum wire width Wmax was 12.0 μm, and the range L of a boundary region was 2.00 cm.

Example 123

In Example 123, the reference wire width W0 of a thin metallic wire was 4.0 μm, the maximum wire width Wmax was 5.6 μm, and the range L of a boundary region was 2.00 cm.

Example 124

In Example 124, the reference wire width W0 of a thin metallic wire was 4.0 μm, the maximum wire width Wmax was 7.2 μm, and the range L of a boundary region was 1.00 cm.

Example 125

In Example 125, the reference wire width W0 of a thin metallic wire was 4.0 μm, the maximum wire width Wmax was 8.0 μm, and the range L of a boundary region was 1.00 cm.

Example 126

In Example 126, the reference wire width W0 of a thin metallic wire was 4.0 μm, the maximum wire width Wmax was 10.0 μm, and the range L of a boundary region was 1.25 cm.

Example 127

In Example 127, the reference wire width W0 of a thin metallic wire was 4.0 μm, the maximum wire width Wmax was 8.0 μm, and the range L of a boundary region was 2.00 cm.

Example 128

In Example 128, the reference wire width W0 of a thin metallic wire was 4.0 μm, the maximum wire width Wmax was 12.0 μm, and the range L of a boundary region was 1.50 cm.

Example 129

In Example 129, the reference wire width W0 of a thin metallic wire was 4.0 μm, the maximum wire width Wmax was 7.2 μm, and the range L of a boundary region was 2.00 cm.

Example 130

In Example 130, the reference wire width W0 of a thin metallic wire was 4.0 μm, the maximum wire width Wmax was 8.0 μm, and the range L of a boundary region was 1.34 cm.

Example 131

In Example 131, the reference wire width W0 of a thin metallic wire was 4.0 μm, the maximum wire width Wmax was 7.2 μm, and the range L, of a boundary region was 1.20 cm.

Example 132

In Example 132, the reference wire width W0 of a thin metallic wire was 4.0 μm, the maximum wire width Wmax was 7.2 μm, and the range L of a boundary region was 1.00 cm.

Example 133

In Example 133, the reference wire width W0 of a thin metallic wire was 4.0 μm, the maximum wire width Wmax was 8.0 μm, and the range L of a boundary region was 2.20 cm.

Comparative Example 7

In Comparative Example 7, thin metallic wires had no change in wire width. The wire width of a thin metallic wire was 4.0 μm. In Comparative Example 7, both the reference wire width W0 and the maximum wire width Wmax were 4.0 μm.

Example 141

In Example 141, the reference wire width W0 of a thin metallic wire was 3.0 μm, the maximum wire width Wmax was 3.27 μm, and the range L of a boundary region was 3.50 cm.

Example 142

In Example 142, the reference wire width W0 of a thin metallic wire was 3.0 μm, the maximum wire width Wmax was 9.0 μm, and the range L of a boundary region was 2.00 cm.

Example 143

In Example 143, the reference wire width W0 of a thin metallic wire was 3.0 μm, the maximum wire width Wmax was 4.2 μm, and the range L of a boundary region was 2.00 cm.

Example 144

In Example 144, the reference wire width W0 of a thin metallic wire was 3.0 μm, the maximum wire width Wmax was 5.4 μm, and the range L of a boundary region was 1.00 cm.

Example 145

In Example 145, the reference wire width W0 of a thin metallic wire was 3.0 μm, the maximum wire width Wmax was 6.0 μm, and the range L of a boundary region was 1.00 cm.

Example 146

In Example 146, the reference wire width W0 of a thin metallic wire was 3.0 μm, the maximum wire width Wmax was 7.5 μm, and the range L of a boundary region was 1.25 cm.

Example 147

In Example 147, the reference wire width W0 of a thin metallic wire was 3.0 μm, the maximum wire width Wmax was 6.0 nm, and the range L of a boundary region was 2.00 cm.

Example 148

In Example 148, the reference wire width W0 of a thin metallic wire was 3.0 μm, the maximum wire width Wmax was 9.0 μm, and the range L of a boundary region was 1.50 cm.

Example 149

In Example 149, the reference wire width W0 of a thin metallic wire was 3.0 μm, the maximum wire width Wmax was 5.4 μm, and the range L of a boundary region was 2.00 cm.

Example 150

In Example 150, the reference wire width W0 of a thin metallic wire was 3.0 μm, the maximum wire width Wmax was 6.0 μm, and the range L of a boundary region was 1.34 cm.

Example 151

In Example 151, the reference wire width W0 of a thin metallic wire was 3.0 μm, the maximum wire width Wmax was 5.4 μm, and the range L of a boundary region was 1.20 cm.

Example 152

In Example 152, the reference wire width W0 of a thin metallic wire was 3.0 μm, the maximum wire width Wmax was 5.4 μm, and the range L of a boundary region was 1.00 cm.

Example 153

In Example 153, the reference wire width W0 of a thin metallic wire was 3.0 μm, the maximum wire width Wmax was 6.0 μm, and the range L of a boundary region was 2.20 cm.

Comparative Example 8

In Comparative Example 8, thin metallic wires had no change in wire width. The wire width of a thin metallic wire was 3.0 μm. In Comparative Example 8, both the reference wire width W0 and the maximum wire width Wmax were 3.0 μm.

Example 161

In Example 161, the reference wire width W0 of a thin metallic wire was 2.5 μm, the maximum wire width Wmax was 2.73 μm, and the range L of a boundary region was 3.50 cm.

Example 162

In Example 162, the reference wire width W0 of a thin metallic wire was 2.5 μm, the maximum wire width Wmax was 7.5 μm, and the range L of a boundary region was 2.00 cm.

Example 163

In Example 163, the reference wire width W0 of a thin metallic wire was 2.5 μm, the maximum wire width Wmax was 3.5 μm, and the range L of a boundary region was 2.00 cm.

Example 164

In Example 164, the reference wire width W0 of a thin metallic wire was 2.5 μm, the maximum wire width Wmax was 4.5 μm, and the range L of a boundary region was 1.00 cm.

Example 165

In Example 165, the reference wire width W0 of a thin metallic wire was 2.5 μm, the maximum wire width Wmax was 5.0 μm, and the range L of a boundary region was 1.00 cm.

Example 166

In Example 166, the reference wire width W0 of a thin metallic wire was 2.5 μm, the maximum wire width Wmax was 6.3 μm, and the range L of a boundary region was 1.25 cm.

Example 167

In Example 167, the reference wire width W0 of a thin metallic wire was 2.5 μm, the maximum wire width Wmax was 5.0 μm, and the range L of a boundary region was 2.00 cm.

Example 168

In Example 168, the reference wire width W0 of a thin metallic wire was 2.5 μm, the maximum wire width Wmax was 7.5 μm, and the range L of a boundary region was 1.50 cm.

Example 169

In Example 169, the reference wire width W0 of a thin metallic wire was 2.5 μm, the maximum wire width Wmax was 4.5 μm, and the range L of a boundary region was 2.00 cm.

Example 170

In Example 170, the reference wire width W0 of a thin metallic wire was 2.5 μm, the maximum wire width Wmax was 5.0 μm, and the range L of a boundary region was 1.34 cm.

Example 171

In Example 171, the reference wire width W0 of a thin metallic wire was 2.5 μm, the maximum wire width Wmax was 4.5 μm, and the range L of a boundary region was 1.20 cm.

Example 172

In Example 172, the reference wire width W0 of a thin metallic wire was 2.5 μm, the maximum wire width Wmax was 4.5 and the range L of a boundary region was 1.00 cm.

Example 173

In Example 173, the reference wire width W0 of a thin metallic wire was 2.5 μm, the maximum wire width Wmax was 5.0 μm, and the range L of a boundary region was 2.20 cm.

Comparative Example 9

In Comparative Example 9, thin metallic wires had no change in wire width. The wire width of a thin metallic wire was 2.5 μm. In Comparative Example 9, both the reference wire width W0 and the maximum wire width Wmax were 2.5 μm.

In the following Table 3, P1 represents the value of $0.5 \times Wmax/W0$, and P2 represents the value of $4.77 \times (Wmax/W0) - 4.19$. The symbol "—" represents zero.

TABLE 3

| | W0 [μm] | Wmax [μm] | L [cm] | Wmax/W0 | Y [/cm] | P1 | P2 | Image Quality Evaluation | Resistance Evaluation |
|---|---|---|---|---|---|---|---|---|---|
| Example 121 | 4.0 | 4.36 | 3.50 | 1.09 | 0.31 | 0.55 | 0.29 | B | B |
| Example 122 | 4.0 | 12.0 | 2.00 | 3.0 | 1.50 | 1.50 | 9.40 | B | AA |
| Example 123 | 4.0 | 5.6 | 2.00 | 1.4 | 0.70 | 0.70 | 1.77 | AAA | A |
| Example 124 | 4.0 | 7.2 | 1.00 | 1.8 | 1.80 | 0.90 | 3.68 | A | A |
| Example 125 | 4.0 | 8.0 | 1.00 | 2.0 | 2.00 | 1.00 | 4.63 | A | A |
| Example 126 | 4.0 | 10.0 | 1.25 | 2.5 | 2.00 | 1.25 | 7.02 | A | AA |
| Example 127 | 4.0 | 8.0 | 2.00 | 2.0 | 1.00 | 1.00 | 4.63 | AAA | AA |
| Example 128 | 4.0 | 12.0 | 1.50 | 3.0 | 2.00 | 1.50 | 9.40 | B | AA |
| Example 129 | 4.0 | 7.2 | 2.00 | 1.8 | 0.90 | 0.90 | 3.68 | AAA | A |
| Example 130 | 4.0 | 8.0 | 1.34 | 2.0 | 1.49 | 1.00 | 4.63 | AA | A |
| Example 131 | 4.0 | 7.2 | 1.20 | 1.8 | 1.50 | 0.90 | 3.68 | AA | A |
| Example 132 | 4.0 | 7.2 | 1.00 | 1.8 | 1.80 | 0.90 | 3.68 | A | A |
| Example 133 | 4.0 | 8.0 | 2.20 | 2.0 | 0.91 | 1.00 | 4.63 | B | AA |
| Comparative Example 7 | 4.0 | 4.0 | — | 1.0 | — | — | — | AAA | C |
| Example 141 | 3.0 | 3.7 | 3.50 | 1.09 | 0.31 | 0.55 | 0.9 | B | B |
| Example 142 | 3.0 | 9.0 | 2.00 | 3.0 | 1.50 | 1.50 | 9.40 | B | AA |
| Example 143 | 3.0 | 4.2 | 2.00 | 1.4 | 0.70 | 0.70 | 1.77 | AAA | A |
| Example 144 | 3.0 | 5.4 | 1.00 | 1.8 | 1.80 | 0.90 | 3.68 | A | A |
| Example 145 | 3.0 | 6.0 | 1.00 | 2.0 | 2.00 | 1.00 | 4.63 | A | A |
| Example 146 | 3.0 | 7.5 | 1.25 | 2.5 | 2.00 | 1.25 | 7.02 | A | AA |
| Example 147 | 3.0 | 6.0 | 2.00 | 2.0 | 1.00 | 1.00 | 4.63 | AAA | AA |
| Example 148 | 3.0 | 9.0 | 1.50 | 3.0 | 2.00 | 1.50 | 9.40 | B | AA |
| Example 149 | 3.0 | 5.4 | 2.00 | 1.8 | 0.90 | 0.90 | 3.68 | AAA | A |
| Example 150 | 3.0 | 6.0 | 1.34 | 2.0 | 1.49 | 1.00 | 4.63 | AA | A |
| Example 151 | 3.0 | 5.4 | 1.20 | 1.8 | 1.50 | 0.90 | 3.68 | AA | A |
| Example 152 | 3.0 | 5.4 | 1.00 | 1.8 | 1.80 | 0.90 | 3.68 | A | A |
| Example 153 | 3.0 | 6.0 | 2.20 | 2.0 | 0.91 | 1.00 | 4.63 | B | AA |
| Comparative Example 8 | 3.0 | 3.0 | — | 1.0 | — | — | — | AAA | C |
| Example 161 | 2.5 | 2.73 | 3.50 | 1.09 | 0.31 | 0.55 | 0.29 | B | B |
| Example 162 | 2.5 | 7.5 | 2.00 | 3.0 | 1.50 | 1.50 | 9.40 | B | AA |
| Example 163 | 2.5 | 3.5 | 2.00 | 1.4 | 0.70 | 0.70 | 1.77 | AAA | A |
| Example 164 | 2.5 | 4.5 | 1.00 | 1.8 | 1.80 | 0.90 | 3.68 | A | A |
| Example 165 | 2.5 | 5.0 | 1.00 | 2.0 | 2.00 | 1.00 | 4.63 | A | A |
| Example 166 | 2.5 | 6.3 | 1.25 | 2.5 | 2.00 | 1.25 | 7.02 | A | AA |
| Example 167 | 2.5 | 5.0 | 2.00 | 2.0 | 1.00 | 1.00 | 4.63 | AAA | AA |
| Example 168 | 2.5 | 7.5 | 1.50 | 3.0 | 2.00 | 1.50 | 9.40 | B | AA |
| Example 169 | 2.5 | 4.5 | 2.00 | 1.8 | 0.90 | 0.90 | 3.68 | AAA | A |
| Example 170 | 2.5 | 5.0 | 1.34 | 2.0 | 1.49 | 1.00 | 4.63 | AA | A |
| Example 171 | 2.5 | 4.5 | 1.20 | 1.8 | 1.50 | 0.90 | 3.68 | AA | A |
| Example 172 | 2.5 | 4.5 | 1.00 | 1.8 | 1.80 | 0.90 | 3.68 | A | A |
| Example 173 | 2.5 | 5.0 | 2.20 | 2.0 | 0.91 | 1.00 | 4.63 | B | AA |
| Comparative Example 9 | 2.5 | 2.5 | — | 1.0 | — | — | — | AA | C |

As shown in Table 3, in each of Examples 121 to 133, 141 to 153, and 161 to 173, both the image quality evaluation grade and the resistance evaluation grade were "B" or higher, and it was possible to achieve both high image quality and low resistance. On the other hand, in Comparative Examples 7, 8, and 9, the resistance evaluation grade was low, and it was impossible to achieve both high image quality and low resistance.

In Examples 121 and 133 in which the length of the range L of a boundary region is greater than 2 cm, it is thought that the range of the boundary region is wide, and thus image quality degradation of the edge portion is easily observed through observer's eyes, and the image quality evaluation grade is "B".

In Examples 122 and 128 in which Wmax/W0 is greater than 2.5, it is thought that the change of the wire width is large, and thus the change is easily observed through observer's eyes, and the image quality evaluation grade is "B".

In a case where the reference wire width is 3.0 μm, in Examples 141 and 153 in which the length of the range L of a boundary region is greater than 2 cm, it is thought that the range of the boundary region is wide, and thus image quality degradation of the edge portion is easily observed through observer's eyes, and the image quality evaluation grade is "B".

In Examples 142 and 148 in which Wmax/W0 is greater than 2.5, it is thought that the change of the wire width is large, and thus the change is easily observed through observer's eyes, and the image quality evaluation grade is "B".

In a case where the reference wire width is 2.5 μm, in Examples 161 and 173 in which the length of the range L of a boundary region is greater than 2 cm, it is thought that the range of the boundary region is wide, and thus image quality degradation of the edge portion is easily observed through observer's eyes, and the image quality evaluation grade is "B".

In Examples 162 and 168 in which Wmax/W0 is greater than 2.5, it is thought that the change of the wire width is large, and thus the change is easily observed through observer's eyes, and the image quality evaluation grade is "B".

EXPLANATION OF REFERENCES 10, 11: conductive film
10a, 12a, 30a, 31a: front surface
12: protective layer
13: touch sensor
14: controller
16: touch panel
18: optically transparent layer
20: display device
22: display unit
24: display equipment
30, 31: transparent substrate
30b: rear surface
30c: one side
32, 32a, 32b: first detecting electrode
33: first peripheral wire
34, 34a: second detecting electrode
35: second peripheral wire
36: first region
37: boundary line
38: second region
39: terminal
40: thin metallic wire
50: first peripheral wiring portion
52: second peripheral wiring portion
53: detecting portion
54: decorative plate
56: adhesive layer
60: dummy electrode
62: gap
$B_E$: electrode boundary
$B_C$: boundary
C: point
D1: first direction
D2: second direction
D3: lamination direction
Db: boundary region
Dc: wire width change region
Dn: direction
L1, L2, L3, L4: straight line
S: region
t: thickness
w: wire width

What is claimed is:

1. A touch panel comprising:
a conductive film;
a protective layer which is provided on the conductive film to protect the conductive film; and
a display device which has a display unit,
wherein the conductive film includes:
a transparent substrate;
a detecting portion which is provided on at least one surface of the transparent substrate and is provided with a mesh pattern formed of thin metallic wires; and
a peripheral wiring portion which is provided on at least one surface of the transparent substrate and is electrically connected to the detecting portion, and
wherein in a case where a region where the detecting portion is provided is set as a first region and a region other than the first region is set as a second region in the transparent substrate,
a wire width change region is present in at least a part of a boundary region including a boundary line between the first region and the second region,
in the wire width change region, a wire width of the thin metallic wire of the detecting portion is larger than a reference wire width of the thin metallic wire at a center of the first region, and is continuously increased along a direction from the first region to the second region,
the first region is superposed on a display region of the display unit such that the conductive film is disposed on the display device, and
the wire width change region is present on an edge portion of the display region of the display unit, and
wherein in a case where an increase rate of the wire width of the thin metallic wire is represented by Y, a reference wire width of the thin metallic wire at the center of the first region is represented by W0, a largest wire width of the thin metallic wire in the first region is represented by Wmax, and a ratio of the largest wire width to the reference wire width is represented by Wmax/W0, following formulae are simultaneously satisfied, $Y \leq 2.0$ $W\max/W0 \leq 2.5$ $0.5 \times (W\max/W0) \leq Y$ $Y \leq 4.77 \times (W\max/W0) - 4.19.$ 2. The touch panel according to claim 1,
wherein the boundary region is a region including the boundary line and extending across the first region and the second region.

3. The touch panel according to claim 2,
wherein the wire width change region is present throughout the entire boundary region.

4. The touch panel according to claim 2,
wherein the boundary region has a quadrangular shape, and the wire width change region is present at a part of at least one side of the quadrangular shape.

5. The touch panel according to claim 4,
wherein the detecting portion has a plurality of detecting electrodes, the peripheral wiring portion has a plurality of peripheral wires, and the plurality of detecting electrodes are electrically connected to the plurality of peripheral wires, respectively, and
the wire width change region is present in the boundary region of a detecting electrode, to which the longest peripheral wire is connected, among the plurality of detecting electrodes.

6. The touch panel according to claim 5,
wherein the detecting portion has a dummy electrode which is electrically insulated from the detecting electrode.

7. The touch panel according to claim 2,
wherein the detecting portion has a plurality of detecting electrodes, the peripheral wiring portion has a plurality of peripheral wires, and the plurality of detecting electrodes are electrically connected to the plurality of peripheral wires, respectively, and
the wire width change region is present in the boundary region of a detecting electrode, to which the longest peripheral wire is connected, among the plurality of detecting electrodes.

8. The touch panel according to claim 1,
wherein the wire width change region is present throughout the entire boundary region.

9. The touch panel according to claim 8,
wherein the detecting portion has a plurality of detecting electrodes, the peripheral wiring portion has a plurality of peripheral wires, and the plurality of detecting electrodes are electrically connected to the plurality of peripheral wires, respectively, and
the wire width change region is present in the boundary region of a detecting electrode, to which the longest peripheral wire is connected, among the plurality of detecting electrodes.

10. The touch panel according to claim 1,
wherein the boundary region has a quadrangular shape, and the wire width change region is present at a part of at least one side of the quadrangular shape.

11. The touch panel according to claim 1,
wherein the detecting portion has a plurality of detecting electrodes, the peripheral wiring portion has a plurality of peripheral wires, and the plurality of detecting electrodes are electrically connected to the plurality of peripheral wires, respectively, and
the wire width change region is present in the boundary region of a detecting electrode, to which the longest peripheral wire is connected, among the plurality of detecting electrodes.

12. The touch panel according to claim 11,
wherein the detecting portion has a dummy electrode which is electrically insulated from the detecting electrode.

* * * * *